(12) United States Patent
Shur et al.

(10) Patent No.: US 10,454,006 B2
(45) Date of Patent: *Oct. 22, 2019

(54) HETEROSTRUCTURE INCLUDING ANODIC ALUMINUM OXIDE LAYER

(71) Applicant: Sensor Electronic Technology, Inc., Columbia, SC (US)

(72) Inventors: Michael Shur, Latham, NY (US); Maxim S. Shatalov, Columbia, SC (US); Alexander Dobrinsky, Loudonville, NY (US)

(73) Assignee: Sensor Electronic Technology, Inc., Columbia, SC (US)

(*) Notice: Subject to any disclaimer, the term of this patent is extended or adjusted under 35 U.S.C. 154(b) by 0 days.

This patent is subject to a terminal disclaimer.

(21) Appl. No.: 15/241,425

(22) Filed: Aug. 19, 2016

(65) Prior Publication Data

US 2017/0186905 A1    Jun. 29, 2017

Related U.S. Application Data

(63) Continuation-in-part of application No. 14/504,456, filed on Oct. 2, 2014, now Pat. No. 9,425,353.

(Continued)

(51) Int. Cl.
*H01L 21/02* (2006.01)
*H01L 33/38* (2010.01)
(Continued)

(52) U.S. Cl.
CPC ............ *H01L 33/58* (2013.01); *C25D 11/045* (2013.01); *C25D 11/16* (2013.01); *C25D 11/24* (2013.01);
(Continued)

(58) Field of Classification Search
CPC ......... H01L 21/02258; H01L 21/02178; H01L 21/02203; H01L 21/31687; H01L 21/3167;
(Continued)

(56) References Cited

U.S. PATENT DOCUMENTS 7,326,963 B2   2/2008   Gaska et al.
8,053,789 B2   11/2011  Yoon et al.
(Continued)

FOREIGN PATENT DOCUMENTS

CN    102376830 A       3/2012
EP    1970347 A1 *      9/2008   ............ B22F 1/0007
(Continued)

OTHER PUBLICATIONS

Cox, et al., "OHMIC Contact for GaAs Devices," Solid-St. Electronics, 1967, 8 pages.
(Continued)

*Primary Examiner* — Yu Chen
(74) *Attorney, Agent, or Firm* — LaBatt, LLC

(57) ABSTRACT

A semiconductor structure including an anodic aluminum oxide layer is described. The anodic aluminum oxide layer can include a plurality of pores extending to an adjacent surface of the semiconductor structure. A filler material can penetrate at least some of the plurality of pores and directly contact the surface of the semiconductor structure. In an illustrative embodiment, multiple types of filler material at least partially fill the pores of the aluminum oxide layer.

20 Claims, 14 Drawing Sheets

Related U.S. Application Data

(60) Provisional application No. 61/885,578, filed on Oct. 2, 2013.

(51) Int. Cl.

| | | |
|---|---|---|
| *H01L 33/58* | (2010.01) | |
| *C25D 11/04* | (2006.01) | |
| *C25D 11/24* | (2006.01) | |
| *C25D 11/16* | (2006.01) | |
| *C30B 25/04* | (2006.01) | |
| *H01L 33/32* | (2010.01) | |
| *H01L 33/00* | (2010.01) | |
| *H01L 33/42* | (2010.01) | |
| *H01L 33/40* | (2010.01) | |
| *H01L 33/12* | (2010.01) | |
| *H01L 33/44* | (2010.01) | |
| *H01L 33/14* | (2010.01) | |

(52) U.S. Cl.
CPC ........ *C30B 25/04* (2013.01); *H01L 21/02178* (2013.01); *H01L 21/02203* (2013.01); *H01L 21/02258* (2013.01); *H01L 33/0075* (2013.01); *H01L 33/12* (2013.01); *H01L 33/32* (2013.01); *H01L 33/382* (2013.01); *H01L 33/387* (2013.01); *H01L 33/405* (2013.01); *H01L 33/42* (2013.01); *H01L 33/44* (2013.01); *H01L 33/007* (2013.01); *H01L 33/145* (2013.01); *H01L 2933/0016* (2013.01); *H01L 2933/0058* (2013.01); *H01L 2933/0083* (2013.01); *H01L 2933/0091* (2013.01)

(58) Field of Classification Search
CPC ..... H01L 2224/0351; H01L 2224/2751; H01L 33/36–42; H01L 33/44–46; H01L 33/16; H01L 33/20; H01L 33/22; C25D 1/006; C25D 11/045
See application file for complete search history.

(56) References Cited

U.S. PATENT DOCUMENTS

| | | | |
|---|---|---|---|
| 8,466,033 B2 | 6/2013 | Tu et al. | |
| 9,425,353 B2 | 8/2016 | Shur et al. | |
| 2003/0010971 A1* | 1/2003 | Zhang | B82Y 10/00 257/15 |
| 2004/0157354 A1* | 8/2004 | Kuriyama | B82Y 20/00 438/45 |
| 2006/0118803 A1 | 6/2006 | Lee et al. | |
| 2006/0186431 A1* | 8/2006 | Miki | H01L 33/505 257/100 |
| 2007/0029911 A1* | 2/2007 | Hudspeth | H01J 1/304 313/309 |
| 2007/0221927 A1 | 9/2007 | Chen et al. | |
| 2009/0050909 A1 | 2/2009 | Chen et al. | |
| 2010/0012969 A1 | 1/2010 | Yoon et al. | |
| 2011/0311800 A1* | 12/2011 | Yamashita | C25D 11/20 428/304.4 |
| 2012/0043523 A1 | 2/2012 | Tu et al. | |
| 2013/0146907 A1 | 6/2013 | Lunev et al. | |
| 2014/0016660 A1 | 1/2014 | Lunev et al. | |

FOREIGN PATENT DOCUMENTS

| | | | |
|---|---|---|---|
| JP | 2002050585 A | | 2/2002 |
| JP | 2005339884 A | | 12/2005 |
| JP | 2007251130 A | | 9/2007 |
| JP | 4606775 B2 | | 1/2011 |
| KR | 20060040422 A | | 5/2006 |
| KR | 20060064306 A | | 6/2006 |
| KR | 20080006815 A | * | 1/2008 |
| KR | 20080061695 A | | 7/2008 |
| KR | 1020110130907 A | | 12/2011 |

OTHER PUBLICATIONS

Chen, et al., "A nanoporous AlN layer patterned by anodic aluminum oxide and its application as a buffer layer in a GaN-based light-emitting diode," Nanotechnology, Feb. 2009, vol. 20, No. 8, 5 pages.

Dai et al., "GaN-based light emitting diodes with large area surface nano-structures patterned by anodic aluminum oxide templates," Peking University, 2008, 9 pages.

Jani, et al., "Nanoporous anodic aluminium oxide: Advances in surface engineering and emerging applications," Progress in Materials Science, Jun. 2013, 69 pages, vol. 58, No. 5.

Nguyen, "Preparing nano-hole arrays by using porous anodic aluminum oxide nano-structural masks for the enhanced emission from InGaN/GaN blue light-emitting diodes," Advances in Natural Sciences: Nanoscience and Nanotechnology, Dec. 2012, vol. 3, No. 4, 5 pages.

Tsai, et al., "Enhanced Performance of a GaN-Based LED Prepared by an Anodized Aluminum Oxide-Nanoporous Pattern Sapphire Substrate," IEEE Electron Device Letters, Jul. 2013, 3 pages, vol. 34, No. 7.

International Search Report and Written Opinion for PCT Application No. US2014058712, dated Jan. 14, 2015, 11 pages.

Chen, Y., U.S. Appl. No. 14/504,456, Notice of Allowance, dated Apr. 20, 2016, 9 pages.

Chen, Y., U.S. Appl. No. 14/504,456, Final Office Action 1, dated Mar. 4, 2016, 17 pages.

Chen, Y., U.S. Appl. No. 14/504,456, Office Action 1, dated Sep. 17, 2015, 24 pages.

Denhoff, M.W., "An Accurate Calculation of Spreading Resistance," 2006, 6 pages.

Yoon, KR Application No. 10-2016-7011496, Office Action (with English translation), dated May 20, 2018, 11 pages.

\* cited by examiner

1 μm   Mag = 10.00 K X

100nm   Mag = 100.00 K X

1 µm    Mag = 10.00 K X

100nm    Mag = 100.00 K X

HETEROSTRUCTURE INCLUDING ANODIC ALUMINUM OXIDE LAYER

REFERENCE TO RELATED APPLICATIONS

The current application is a continuation-in-part of U.S. patent application Ser. No. 14/504,456, which was filed on 2 Oct. 2014, and which claims the benefit of U.S. Provisional Application No. 61/885,578, which was filed on 2 Oct. 2013, both of which are hereby incorporated by reference.

GOVERNMENT LICENSE RIGHTS

This invention was made with government support under contract no. W911NF-09-C-0160 awarded by the U.S. Army Research Office. The U.S. government has certain rights in the invention.

TECHNICAL FIELD

The disclosure relates generally to semiconductor heterostructures, and more particularly, to a semiconductor heterostructure including one or more anodic aluminum oxide layers.

BACKGROUND ART

Anodic aluminum oxide (AAO) has been previously investigated and utilized in numerous products. Recently, interest in nanoscale materials and their outstanding properties has rapidly increased. AAO is one of the most popular nanomaterials with various applications including: molecular separation, catalysis, energy generation and storage, electronics and photonics, sensors and biosensors, drug delivery, and template synthesis. Material fabrication of AAO is based on an inexpensive electrochemical anodization with a self-ordering process of nanopores. AAO fabrication does not require any lithography or templating, and the process results in well ordered and size controlled nanopores. The density and size of the nanopores can be controlled to a certain degree during fabrication. Recent research into AAO is characterized by a large number of innovations, in particular with regard to controlling and designing intricate structural features, such as modulated, branched, and multilayered pore architectures.

Interest in utilizing AAO technology to improve the efficiency of optoelectronic devices, such as light emitting diodes, is increasing. In particular, group III nitride (Al-GaN)-based light emitting diodes (LEDs) have attracted considerable attention as components in solid-state lighting. However, for light emitting diodes emitting in the ultraviolet range, light extraction efficiency as well as an overall efficiency of such devices must be improved to make them a viable alternative to UV emitting lamps, such as mercury based emitters. In optoelectronic devices, AAO technology has been utilized, for example, as a mask to pattern a substrate or a semiconductor layer in preparation for epitaxial growth. For example, in one approach, an AAO mask was formed over an aluminum nitride (AlN) buffer layer grown on a sapphire substrate. The AAO mask was generated by first depositing a few micron thick layer of aluminum over the AlN layer (which was deposited in turn using reactive sputtering). Subsequently, a two-step anodization was applied to achieve a nanoporous alumina layer. Using the nanoporous AAO template as a mask, the substrate was etched using argon (Ar) plasma until all of the AAO mask was etched away to form a nanoporous AlN layer. The nanoporous AlN layer was used to grow a gallium nitride (GaN) based semiconductor heterostructure, which was used to fabricate a light emitting diode (LED).

In another approach, AAO was used as a mask for etching nano-holes in a surface of a group III nitride-based LED to increase extraction efficiency of the LED. A similar patterning technique has been applied to achieve nano-patterning on a large surface area of a GaN-based LED chip to improve the light extraction efficiency. In this case, the pore spacing was modulated from 100 nm to 400 nm to achieve optimal performance. When operated at twenty milliamps (mA), a light output power enhancement of 42% was obtained from the p-side surface nano-patterned LEDs compared to conventional LEDs fabricated on the same wafer. This approach offers a potential technique for fabricating nanostructures on GaN-based LEDs with the advantages of large area, rapid process, and low cost.

Still another approach proposes to use an AAO film as a dry etching mask to transfer nanoporous patterns onto a sapphire substrate. Subsequently, a semiconductor heterostructure was grown on the sapphire substrate to form a light emitting diode. Epitaxial growth on a patterned substrate allows for reduction in threading dislocations in the semiconductor layers. In addition, air voids formed from the patterning procedure and subsequent growth can effectively reflect photons downward toward the top portion of the LED, thus increasing an overall extraction efficiency of the LED.

Other uses of AAO have been explored. In one approach, AAO was used as a shadow mask to etch n-type semiconductor layers prior to deposition/epitaxial growth of subsequent semiconductor layers during the fabrication of an LED. While this is an advantageous process, it is not the most technological or most cost effective procedure, since it requires at least two metal organic chemical vapor deposition (MOCVD) steps separated by AAO anodization and etching. Splitting MOCVD into two separate steps is ineffective, and etching is a technologically inefficient step. Furthermore, etching can provide for high number of defects in the underlying layer, which can result in damaging effects. In another approach, AAO anodization and etching are performed to pattern the substrate. While this procedure is technologically more amiable, substrate patterning through etching is still a relatively complex step.

SUMMARY OF THE INVENTION

In view of the above, the inventors propose a patterning process that is more practical from a technological point of view from previous approaches. In one embodiment, a p-type contact is patterned by incorporating an anodic aluminum oxide layer therein. An anodic aluminum oxide layer can be incorporated into various locations on the boundaries of a heterostructure and/or within the heterostructure to provide patterning. The patterning can be configured to be based on one or more desired attributes of the corresponding interface, such as conductivity, reflectivity, transparency, stress relief, and/or the like.

Aspects of the invention provide a semiconductor structure including an anodic aluminum oxide layer. The anodic aluminum oxide layer can be located between a semiconductor layer and another layer of material. The anodic aluminum oxide layer can include a plurality of pores extending to an adjacent surface of the semiconductor layer. The layer of material can penetrate at least some of the plurality of pores and directly contact the semiconductor layer. In an illustrative embodiment, the layer of material is a conductive material and the anodic aluminum oxide is located at a p-type contact.

A first aspect of the invention provides a semiconductor structure comprising: a first semiconductor layer; an anodic aluminum oxide layer immediately adjacent to the first semiconductor layer, wherein the anodic aluminum oxide layer includes a plurality of pores extending to an adjacent surface of the first semiconductor layer; and a layer of material immediately adjacent to the anodic aluminum oxide layer, wherein the layer of material penetrates at least some of the plurality of pores and directly contacts the first semiconductor layer.

A second aspect of the invention provides an optoelectronic device comprising: an active region; a p-type layer located on a first side of the active region; an anodic aluminum oxide layer located directly on the p-type layer, wherein the anodic aluminum oxide layer includes a plurality of pores; and a p-type contact located on the anodic aluminum oxide layer, wherein the p-type contact is formed of a conductive material and the conductive material penetrates at least some of the plurality of pores and directly contacts the p-type layer.

A third aspect of the invention provides a method of fabricating a semiconductor structure, the method comprising: forming a first semiconductor layer; forming an anodic aluminum oxide layer immediately adjacent to the first semiconductor layer, wherein the anodic aluminum oxide layer includes a plurality of pores extending to an adjacent surface of the first semiconductor layer; and forming a layer of material immediately adjacent to the anodic aluminum oxide layer, wherein the layer of material penetrates at least some of the plurality of pores and directly contacts the first semiconductor layer.

The illustrative aspects of the invention are designed to solve one or more of the problems herein described and/or one or more other problems not discussed.

BRIEF DESCRIPTION OF THE DRAWINGS

These and other features of the disclosure will be more readily understood from the following detailed description of the various aspects of the invention taken in conjunction with the accompanying drawings that depict various aspects of the invention.

FIG. 14A shows a lens attached to an AAO layer according to an embodiment, while

It is noted that the drawings may not be to scale. The drawings are intended to depict only typical aspects of the invention, and therefore should not be considered as limiting the scope of the invention. In the drawings, like numbering represents like elements between the drawings.

DETAILED DESCRIPTION OF THE INVENTION

As indicated above, aspects of the invention provide a semiconductor structure including an anodic aluminum oxide layer. The anodic aluminum oxide layer can be located between a semiconductor layer and another layer of material. The anodic aluminum oxide layer can include a plurality of pores extending to an adjacent surface of the semiconductor layer. The layer of material can penetrate at least some of the plurality of pores and directly contact the semiconductor layer. In an illustrative embodiment, the layer of material is a conductive material and the anodic aluminum oxide is located at a p-type contact.

As used herein, unless otherwise noted, the term "set" means one or more (i.e., at least one) and the phrase "any solution" means any now known or later developed solution. As also used herein, a layer is a transparent layer when the layer allows at least ten percent of radiation having a target wavelength, which is radiated at a normal incidence to an interface of the layer, to pass there through. Furthermore, as used herein, a layer is a reflective layer when the layer reflects at least ten percent of radiation having a target wavelength, which is radiated at a normal incidence to an interface of the layer. In an embodiment, the target wavelength of the radiation corresponds to a wavelength of radiation emitted or sensed (e.g., peak wavelength +/− five nanometers) by an active region of an optoelectronic device during operation of the device. For a given layer, the wavelength can be measured in a material of consideration and can depend on a refractive index of the material. Additionally, as used herein, a contact is considered "ohmic" when the contact exhibits close to linear current-voltage behavior over a relevant range of currents/voltages to enable use of a linear dependence to approximate the current-voltage relation through the contact region within the relevant range of currents/voltages to a desired accuracy (e.g., +/− one percent).

Aspects of the invention provide a heterostructure that can be incorporated into an optoelectronic device, such as a conventional or super luminescent light emitting diode, a light emitting laser, a laser diode, a light sensor, a photodetector, a photodiode, an avalanche diode, and/or the like.

Figure 1:
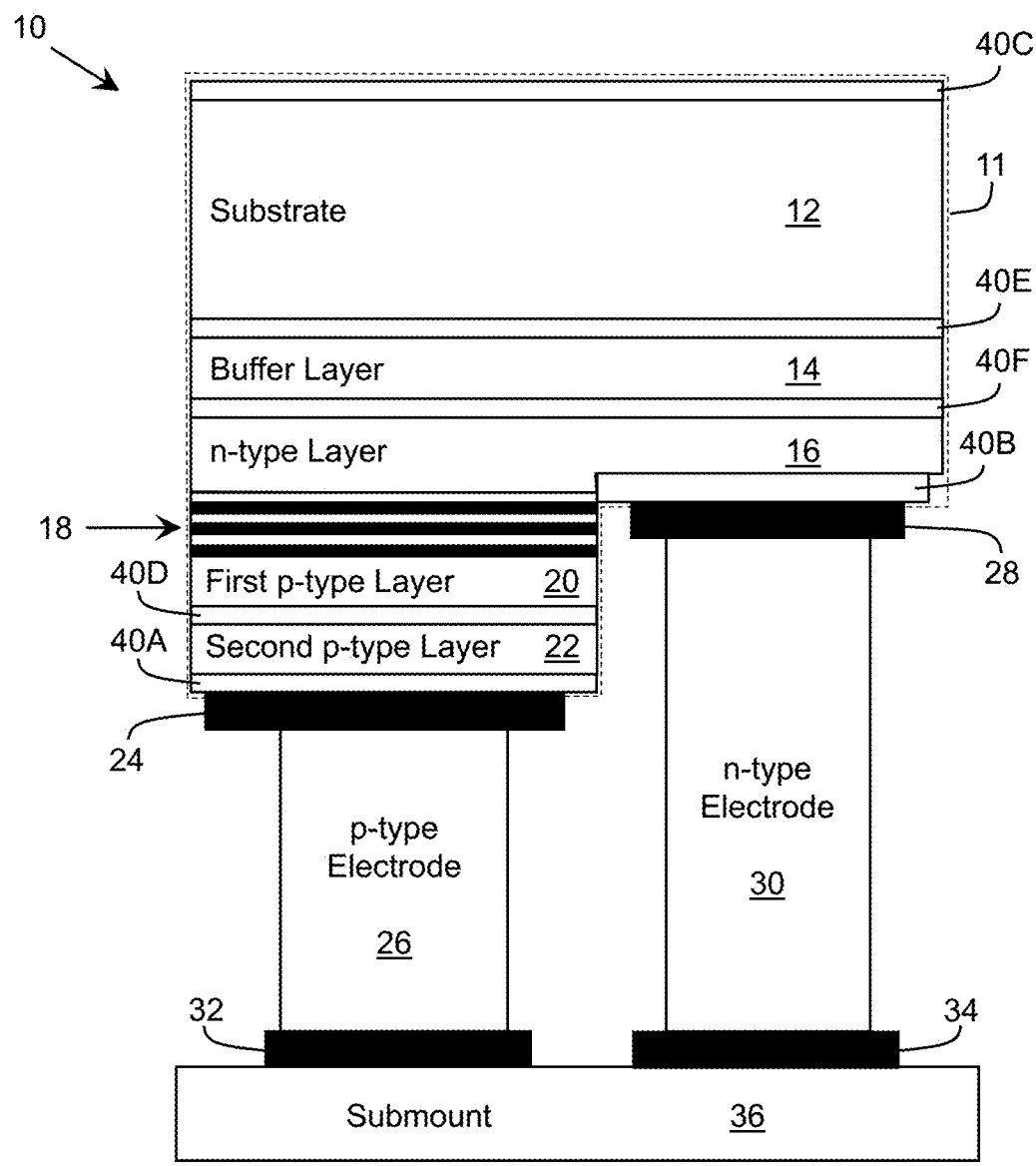
FIG. 1 shows a schematic structure of an illustrative optoelectronic device according to an embodiment.

Turning to the drawings, FIG. 1 shows a schematic structure of an illustrative optoelectronic device 10 according to an embodiment. In a more particular embodiment, the optoelectronic device 10 is configured to operate as an emitting device, such as a light emitting diode (LED) or a laser diode (LD). In either case, during operation of the optoelectronic device 10, application of a bias comparable to the band gap results in the emission of electromagnetic radiation from an active region 18 of the optoelectronic device 10. The electromagnetic radiation emitted (or sensed) by the optoelectronic device 10 can have a peak wavelength within any range of wavelengths, including visible light, ultraviolet radiation, deep ultraviolet radiation, infrared light, and/or the like. In an embodiment, the device 10 is configured to emit (or sense) radiation having a dominant wavelength within the ultraviolet range of wavelengths. In a more specific embodiment, the dominant wavelength is within a range of wavelengths between approximately 210 and approximately 350 nanometers.

The optoelectronic device 10 includes a heterostructure 11 comprising a substrate 12, a buffer layer 14 adjacent to the substrate 12, an n-type layer 16 (e.g., a cladding layer, electron supply layer, contact layer, and/or the like) adjacent to the buffer layer 14, and an active region 18 having an n-type side adjacent to the n-type layer 16. Furthermore, the heterostructure 11 of the optoelectronic device 10 includes a first p-type layer 20 (e.g., an electron blocking layer, a cladding layer, hole supply layer, and/or the like) adjacent to a p-type side of the active region 18 and a second p-type layer 22 (e.g., a cladding layer, hole supply layer, contact layer, and/or the like) adjacent to the first p-type layer 20.

In a more particular illustrative embodiment, the optoelectronic device 10 is a group III-V materials based device, in which some or all of the various layers are formed of elements selected from the group III-V materials system. In a still more particular illustrative embodiment, the various layers of the optoelectronic device 10 are formed of group III nitride based materials. Group III nitride materials comprise one or more group III elements (e.g., boron (B), aluminum (Al), gallium (Ga), and indium (In)) and nitrogen (N), such that $B_WAl_XGa_YIn_ZN$, where $0 \leq W, X, Y, Z \leq 1$, and $W+X+Y+Z=1$. Illustrative group III nitride materials include binary, ternary and quaternary alloys such as, AlN, GaN, InN, BN, AlGaN, AlInN, AlBN, AlGaInN, AlGaBN, AlInBN, and AlGaInBN with any molar fraction of group III elements.

An illustrative embodiment of a group III nitride based optoelectronic device 10 includes an active region 18 (e.g., a series of alternating quantum wells and barriers) composed of $In_yAl_xGa_{1-x-y}N$, $Ga_zIn_yAl_xB_{1-x-y-z}N$, an $Al_xGa_{1-x}N$ semiconductor alloy, or the like. Similarly, the n-type layer 16, the first p-type layer 20, and the second p-type layer 22 can be composed of an $In_yAl_xGa_{1-x-y}N$ alloy, a $Ga_zIn_yAl_xB_{1-x-y-z}N$ alloy, or the like. The molar fractions given by x, y, and z can vary between the various layers 16, 18, 20, and 22. The substrate 12 can be sapphire, silicon carbide (SiC), silicon (Si), GaN, AlGaN, AlON, $LiGaO_2$, or another suitable material, and the buffer layer 14 can be composed of AlN, an AlGaN/AlN superlattice, and/or the like.

The optoelectronic device 10 can further include a p-type contact 24, which can form an ohmic contact to the second p-type layer 22, and a p-type electrode 26 can be attached to the p-type contact 24. Similarly, the optoelectronic device 10 can include an n-type contact 28, which can form an ohmic contact to the n-type layer 16, and an n-type electrode 30 can be attached to the n-type contact 28. The p-type contact 24 and the n-type contact 28 can form ohmic contacts to the corresponding layers 22, 16, respectively.

In an embodiment, the p-type contact 24 and the n-type contact 28 each comprise several conductive and reflective metal layers, while the n-type electrode 30 and the p-type electrode 26 each comprise highly conductive metal. In an embodiment, the second p-type layer 22 and/or the p-type electrode 26 can be transparent to the electromagnetic radiation generated by the active region 18. For example, the second p-type layer 22 and/or the p-type electrode 26 can comprise a short period superlattice lattice structure, such as an at least partially transparent magnesium (Mg)-doped AlGaN/AlGaN short period superlattice structure (SPSL). Furthermore, the p-type electrode 26 and/or the n-type electrode 30 can be reflective of the electromagnetic radiation generated by the active region 18. In another embodiment, the n-type layer 16 and/or the n-type electrode 30 can be formed of a short period superlattice, such as an AlGaN SPSL, which is transparent to the electromagnetic radiation generated by the active region 18.

As further shown with respect to the optoelectronic device 10, the device 10 can be mounted to a submount 36 via the contacts 26, 30 in a flip chip configuration. In this case, the substrate 12 is located on the top of the optoelectronic device 10. To this extent, the p-type electrode 26 and the n-type electrode 30 can both be attached to a submount 36 via contact pads 32, 34, respectively. The submount 36 can be formed of aluminum nitride (AlN), silicon carbide (SiC), and/or the like.

The optoelectronic device 10 is shown including various anodic aluminum oxide (AAO) layers 40A-40F. While six AAO layers 40A-40F are shown, it is understood that embodiments of an optoelectronic device 10 can include any number of one or more of the AAO layers 40A-40F. To this extent, an optoelectronic device can include any combination of one or more of the AAO layers 40A-40F. Similarly, any combination of one or more of the AAO layers 40A-40F may not be included in an optoelectronic device. In an embodiment, an optoelectronic device includes only one or more AAO layers, such as AAO layers 40A-40C, located at various interfaces of the heterostructure 11. Similarly, an embodiment of an optoelectronic device includes one or more AAO layers, such as AAO layers 40D-40F, located within the heterostructure 11.

Any of the various layers of the optoelectronic device 10 can comprise a substantially uniform composition or a graded composition. For example, a layer can comprise a graded composition at a heterointerface with another layer. In an embodiment, the first p-type layer 20 comprises a p-type electron blocking layer having a graded composition. The graded composition(s) can be included to, for example, reduce stress, improve carrier injection, and/or the like. Similarly, a layer can comprise a superlattice including a plurality of periods, which can be configured to reduce stress, and/or the like. In this case, the composition and/or width of each period can vary periodically or aperiodically from period to period.

It is understood that the layer configuration of the optoelectronic device 10 described herein is only illustrative. To this extent, a heterostructure for an optoelectronic device can include an alternative layer configuration, one or more additional layers, and/or the like. As a result, while the various layers are shown immediately adjacent to one another (e.g., contacting one another), it is understood that one or more intermediate layers can be present in a heterostructure for an optoelectronic device. For example, an illustrative heterostructure for an optoelectronic device can include an undoped layer between the active region 18 and one or both of the second p-type layer 22 and the n-type layer 16.

Furthermore, a heterostructure for an optoelectronic device can include a Distributive Bragg Reflector (DBR) structure, which can be configured to reflect light of particular wavelength(s), such as those emitted by the active region 18, thereby enhancing the output power of the device/heterostructure. For example, the DBR structure can be located between the second p-type layer 22 and the active region 18. The DBR structure and/or the first p-type layer 20 can have any composition selected based on a desired wavelength of the light generated by the device. In one embodiment, the DBR structure has a Mg, Mn, Be, or Mg+Si-doped p-type composition. The first p-type layer 20 can be formed of p-type AlGaN, AlInGaN, and/or the like. It is understood that a heterostructure for an optoelectronic device can include both the DBR structure and the first p-type layer 20 (which can be located between the DBR structure and the second p-type layer 22) or can include only one of the DBR structure or the first p-type layer 20. In an embodiment, the first p-type layer 20 can be included in the device/heterostructure in place of an electron blocking layer. In another embodiment, the first p-type layer 20 can be included between the second p-type layer 22 and an electron blocking layer, which is located adjacent to the active region 18.

Regardless, fabrication of the device 10 can be performed using any solution. For example, the various layers of the heterostructure 11 can be epitaxially grown (e.g., deposited) on an adjacent layer using any solution. Each AAO layer 40A-40F can be fabricated using any solution, such as by depositing a thin layer substantially consisting of aluminum and performing an anodizing treatment to the aluminum layer (e.g., by causing the aluminum layer to oxidize). When the heterostructure 11 includes one or more AAO layers within the heterostructure 11, such as AAO layers 40D-40F, a combination of a deposition process (e.g., metal organic chemical vapor deposition (MOCVD)) and anodization procedure can be used to fabricate the heterostructure 11.

Additionally, formation of an AAO layer 40A-40F can include forming a plurality of pores within the AAO layer 40A-40F during the anodizing treatment. In an embodiment, at least some of the pores extend through the AAO layer 40A-40F. In a more particular embodiment, substantially all of the pores extend through the AAO layer 40A-40F. The attributes of the pores, including a characteristic size of the pores (e.g., average diameter), a maximum depth of the pores, a density of the pores, and/or the like, can vary depending on a particular anodization procedure utilized. For example, an AAO layer 40A-40F can be formed by placing an aluminum film into an electrolyte (e.g., oxalic acid, phosphoric acid, sulfuric acid, malonic acid, and/or the like) where a concentration of the acid can be selected depending on a target pore size. Subsequently, formation of the AAO layer 40A-40F can include applying a voltage potential in a range of approximately 35 Volts to approximately 45 Volts for a time period in the range of several hours.

The anodization procedure can be followed by etching the anodized aluminum oxide. For example, such etching can comprise chemical etching including: etching in chromic acid and phosphoric acid while a temperature is in the range of 65-80° C. The phosphoric acid can be in the range of 6 wt % to 7 wt % and the chromic acid can be in the range of 2 wt % to 3 wt %.

Furthermore, a second anodization can be performed by repeating a process substantially similar to or identical to the first anodization. In this case, hexagonally arranged nanoporous structures can be formed with one end blocked an underlying semiconductor layer. A process time for the second anodization can be selected based on a target membrane thickness, and can range, for example, from one hour to forty-eight hours depending on the desired membrane thickness (e.g., a desired depth of the AAO pores).

Anodization can be preceded by electropolishing of aluminum deposited over an underlying layer, or electropolishing an aluminum substrate. The electropolishing may involve placing the aluminum in a mixture of perchloric acid and ethanol, where the ratio of respective chemicals is in the range of 1:3 to 1:5 by volume and a purity of the ethanol is in the range of 99%-99.9% and a purity of the perchloric acid is in the range of 69-72%. Subsequently, a voltage potential in a range of approximately ten volts to approximately twenty volts can be applied at a temperature less than 10° Celsius for 3 to 10 minutes depending on a target surface roughness.

In an embodiment, the p-type contact 24 can be deposited onto an AAO layer 40A including pores, such that at least a portion of the p-type contact 24 penetrates through pores present in the AAO layer 40A. The p-type contact 24 can be annealed to form an ohmic contact to the second p-type layer 22. Similarly, the n-type contact layer 28 can be deposited onto an AAO layer 40B including pores, such that at least a portion of the n-type contact 28 penetrates through the pores present in the AAO layer 40B. The n-type contact 28 can be annealed to form an ohmic contact to the n-type layer 16. Additional details of an interface between a heterostructure 11 and a metallic contact 24, 28 are described in conjunction with a p-type contact. However, it is understood that a similar contact design can be utilized for an n-type contact.

Figure 2A:
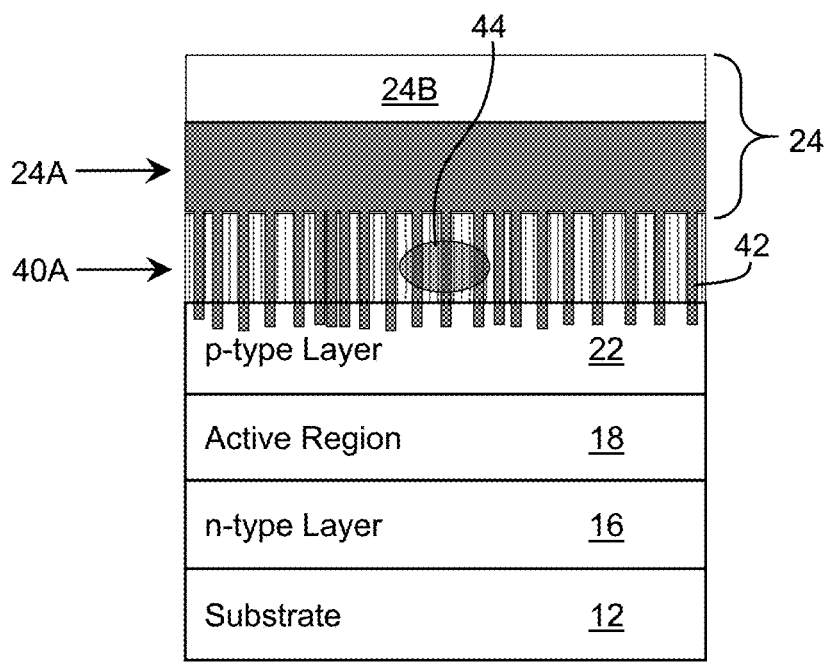
FIGS. 2A and 2B show further details of a p-type contact design using an AAO layer mask according to an embodiment.
Figure 2B:
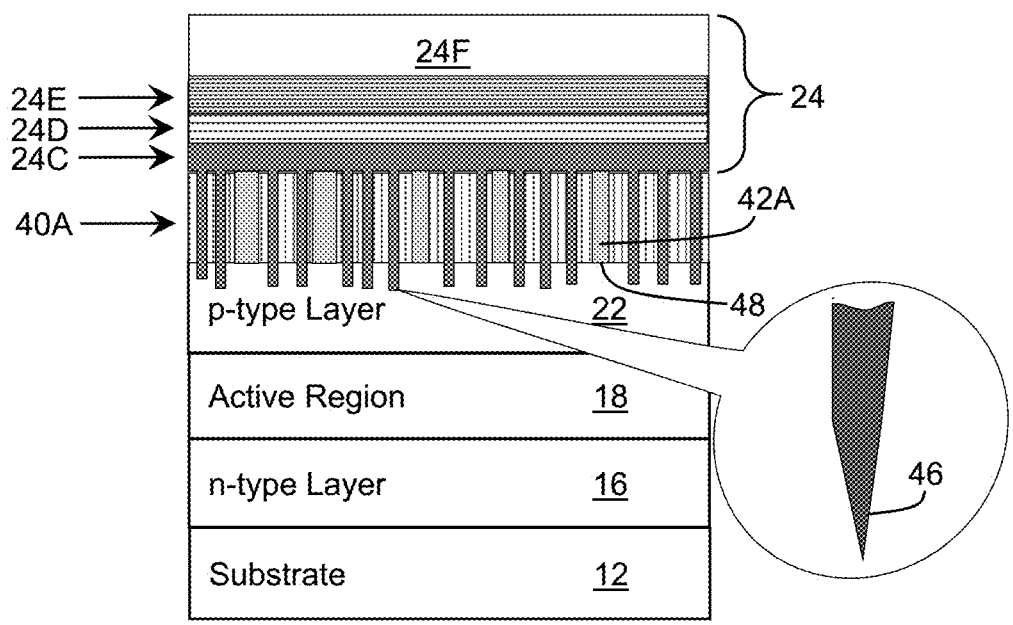

FIGS. 2A and 2B show further details of a p-type contact design using an AAO layer mask, such as the AAO layer 40A of FIG. 1, according to an embodiment. As is known, an epitaxial growth process, such as MOCVD, can be used to form a heterostructure including a series of semiconductor layers on a substrate 12. Typically, the n-type layer(s) 16 are formed, followed by formation of the active region 18, and formation of the p-type layer(s) 22. It is understood that while only a single n-type layer 16 and p-type layer 22 are shown for clarity, a heterostructure can include any combination of various n-type and p-type layers, buffer layers, DBR structures, etc. In an embodiment, the various semiconductor layers of the heterostructure are formed using an uninterrupted MOCVD growth process, thereby resulting in no additional cost associated with stopping and starting the MOCVD growth process. Additionally, an uninterrupted MOCVD growth process can increase reproducibility of the semiconductor heterostructure.

After formation of the p-type layer 22, an AAO layer 40A including a plurality of pores can be fabricated using any solution. For example, an aluminum layer can be deposited directly on the p-type layer 22 followed by an anodization process. The anodization process can be configured to produce pores 42 of a predetermined characteristic size (e.g., average diameter) distributed through the AAO layer 40A at a predetermined density based on various parameters of the anodization process, such as the anodization applied voltage, electrolyte, anodization time, and/or the like. The anodization process can be performed for a predetermined period of time sufficient to allow at least a portion of the pores to penetrate the entire AAO layer 40A, which can result in an orderly array of pores. Furthermore, the AAO layer 40A can be used as a mask to etch pores into an underlying semiconductor layer, such as the p-type layer 22, which can result in pores extending through the AAO layer 40A and protruding into the underlying semiconductor layer.

In an embodiment, the characteristic size and density of the pores 42 are selected based on a current spreading length 44 of the p-type contact 24. For example, the characteristic size and density can be selected such that multiple pores 42 are present within the current spreading length 44. In an embodiment, a characteristic distance between the pores 42 (e.g., as measured between the centers of pores 42) is selected to be smaller than an approximated current spreading length 44 of the p-type contact 24. To this extent, the current spreading length 44, l, can be approximated as:

$$l = \sqrt{2a(rb)/a\tan\left(\frac{2rb}{a}\right)},$$

where b is a thickness of the p-type contact 24, a is a radius of the pores 42, and $r=\rho_\perp/\rho_\parallel$, where $\rho_\parallel$ is a resistivity along the lateral direction of the p-type contact 24 and $\rho_\perp$ is a resistivity in the normal direction of the p-type contact 24.

Subsequently, the p-type contact 24 can be deposited over the AAO layer 40A. The p-type contact 24 can be formed of any type of material, which makes a good ohmic contact to the semiconductor layer (e.g., the p-type layer 22) on which the contact 24 is located. For a p-type ohmic contact, materials having a high work function (e.g., above five electron volts) are typically utilized, such as nickel (Ni) and palladium (Pd). In an embodiment, the p-type contact 24 includes an ohmic layer formed of two or more sub-layers 24A, 24B, which can have an abrupt interface during deposition. In an embodiment, the sub-layers 24A, 24B of the p-type contact 24 are partially alloyed. One or more of the metals can be, for example: cobalt (Co), nickel (Ni), palladium (Pd), iron (Fe), and platinum (Pt). Additionally, one or more of the metals can be: Pd, rhodium (Rh), ruthenium (Ru), osmium (Os), iridium (Ir), thorium (Th), and boron (B), which can incorporate one or more of: calcium (Ca), magnesium (Mg), beryllium (Be), manganese (Mn), or tin (Sn), with a maximum concentration up to approximately $10^{21}$ cm$^{-3}$. Alternatively, one or more of the sub-layers 24A, 24B can comprise a non-metal. For example, in an embodiment, the sub-layer 24A is formed of a transparent conductive oxide such as tin-doped gallium oxide ($Ga_2O_3$), tin-doped indium oxide (ITO), and/or the like.

Furthermore, the p-type contact 24 can include multiple layers, each of which is included for a distinct purpose. An illustrative multi-layer contact is shown and described in U.S. patent application Ser. No. 13/711,675, titled "Ultraviolet Reflective Contact," which was filed in 12 Dec. 2012 and is hereby incorporated by reference. For example, as shown in FIG. 2B, the p-type contact 24 can include a layered stack including: an ohmic layer 24C, such as a thin nickel layer; an ohmic protective/ohmic enhancing layer 24D, such as rhodium; a reflective layer 24E, such as aluminum; and a reflective protective layer 24F. The protective layers 24D, 24F can comprise any type of material and have a minimum thickness to prevent diffusion of a subsequent layer into the lower layer during fabrication. The reflective layer 24E can be formed of any material reflective of light having a target wavelength, e.g., corresponding to the wavelength of the light generated by the active region 18.

Regardless, when deposited, the ohmic layer of the p-type contact 24 can penetrate at least some of the AAO pores 42 and contact the p-type layer 22. While FIG. 2A shows all of the AAO pores 42 penetrated by the p-type contact 24, it is understood that not all of the AAO pores 42 need to be filled. To this extent, FIG. 2B shows an embodiment in which several AAO pores 42A remain open. In an embodiment, a relative number of pores that are filled by the material of the p-type contact 24 is sufficient such that a total resulting contact resistance between the p-type contact 24 and the p-type layer 22 is no more than a few percent (e.g., less than ten percent) of the overall resistance of the device.

The presence of open pores 42A can result in an enhanced reflection of radiation from the AAO layer 40A due to total internal reflection at an interface 48 between the p-type layer 22 and the gas present in the open AAO pore 42A. In an embodiment, a distribution of the open and filled pores can be configured to correspond to a target distribution. For example, the ohmic layer 24C of the p-type contact 24 can be deposited in the form of islands at various locations on the AAO layer 40A, which can result in regions of filled AAO pores 42 that are mostly filled and regions of AAO pores 42A that are mostly open.

After depositing the p-type contact 24, the structure can be annealed. The annealing can be configured to result in the p-type contact 24 penetrating the p-type layer 22 and forming an improved ohmic contact. Formation of an ohmic contact can include annealing in nitrogen, argon, oxygen, and/or the like, containing ambient at a temperature of 450-800 degrees Celsius. The annealing can include rapid thermal annealing (e.g., heating the structure to 600 degrees Celsius and subsequently cooling the structure at rates of approximately eight degrees Celsius per second). As illustrated in the enlarged section of FIG. 2B, the p-type contact 24 can terminate with sharp ends 46 in the p-type layer 22, which can result in high electric field amplitudes at the tip region, further promoting conductivity. While the p-type contact 24 has primarily been described as an ohmic contact, it is understood that the p-type contact 24 can form a semi-ohmic contact, e.g., a contact which does not have a linear behavior, but may be a Schottky contact with a Schottky barrier being sufficiently small such that a total resulting contact resistance between the p-type contact 24 and the p-type layer 22 is no more than a few percent (e.g., less than ten percent) of the overall resistance of the device.

In an embodiment, the formation of an ohmic contact can be further facilitated by etching a surface of the p-type layer 22 using any solution. For example, the p-type layer 22 can be etched prior to applying the AAO layer 40A. In an embodiment, the surface of the p-type layer 22 is etched by partially etching the AAO layer 40A and the exposed surfaces of the p-type layer 22 prior to depositing the p-type contact 24. Such etching can be performed to induce the formation of grooves in regions of the p-type layer 22 exposed by the AAO pores 42 and/or to modify the underlying p-type layer 22. After the etching, the p-type contact 24 can be deposited over the remaining AAO layer 40A through at least some of the AAO pores 42, and into the grooves formed on the surface of the p-type layer 22 in order to form an ohmic contact with better conductivity characteristics.

Returning to FIG. 1, an AAO layer 40C can be formed on the surface of the substrate 12 opposite to the epitaxial growth surface. The AAO layer 40C can be configured to improve the transmission properties of the top surface of the optoelectronic device 10, which can result in, for example, improved light extraction from an emitting device. For example, the AAO layer 40C can include pores, which are configured to provide a nano-roughness region, a region having a controlled average index of refraction, and/or the like. The average index of refraction can be calculated by averaging the refractive index of AAO and the refractive index of the gas (e.g., a refractive index of one for the gas can be assumed). The average index of refraction can be calculated for each height of the AAO layer by: (nAAO×A1+ngas×A2), wherein nAAO is the refractive index of AAO, ngas is the refractive index of gas, A1 is the fraction of the lateral area (taken at a given height of the layer) containing AAO, and A2 is the fraction of lateral area containing gas (the fraction of lateral area occupied by pores, taken at a given height of the layer). The average index of refraction can be a variable quantity across the layer thickness provided that the size of the AAO pores (and as a result the fraction of the area A2 occupied by pores) is changing throughout the layer thickness. Such variation in pore sizes can be achieved, for example, by varying applied voltage during the anodization process.

In an embodiment, during epitaxial growth of the semiconductor layers of the heterostructure 11, the growth process (e.g., MOCVD) can be stopped one or more times to incorporate an AAO layer, such as one or more of the AAO layers 40D-40F, within the heterostructure 11. After formation of the AAO layer 40D-40F, the growth process can be restarted to form additional semiconductor layers. While three illustrative locations of AAO layers 40D-40F are shown and described herein, it is understood that these locations are only illustrative of various locations within the heterostructure 11 where an AAO layer can be incorporated.

Regardless, the AAO layer 40D can be incorporated into the heterostructure 11 prior to growing the second p-type layer 22. For example, epitaxial growth of the semiconductor layers in the heterostructure 11 can be continuous until growth of the first p-type layer 20 (e.g., an electron blocking layer) is complete. Subsequently, the AAO layer 40D including pores can be applied. In this case, growth of the second p-type layer 22 can occur within the pores 42 (FIG. 2A) of the AAO layer 40D, with subsequent lateral overgrowth above the top surface of the AAO layer 40D. The second p-type layer 22 can be formed of a material having low or no aluminum content, e.g., gallium nitride. Such a material is amiable to lateral overgrowth and can result in the second p-type layer 22 having a fraction of point and threading dislocation defects as would have resulted without the AAO layer 40D. As a result, this approach can contribute to increased reliability and stability of the optoelectronic device 10.

Figure 3:
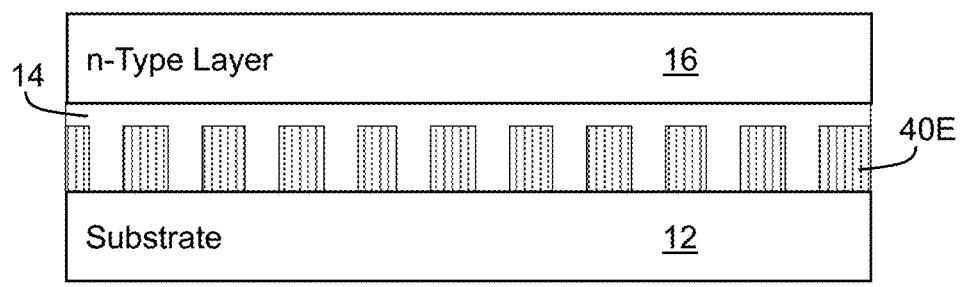
FIG. 3 shows an illustrative schematic structure of a buffer layer grown over an AAO layer according to an embodiment.

The AAO layer 40E can be formed on a surface of the substrate 12 prior to commencing epitaxial growth of the semiconductor layers of the heterostructure 11. To this extent, FIG. 3 shows an illustrative schematic structure of a buffer layer 14 grown over an AAO layer 40E according to an embodiment. In an illustrative embodiment, the substrate 12 is sapphire, which has the same chemical composition as the AAO layer 40E. Regardless, as illustrated, the AAO layer 40E can provide a patterned surface on which the buffer layer 14 is grown, which can provide stress relief in the formation of the buffer layer 14. Additionally, the AAO layer 40E can be configured to provide wave guiding as described herein. Subsequently, the epitaxial growth process can continue with growth of the n-type layer 16 on the buffer layer 14.

Figure 4:
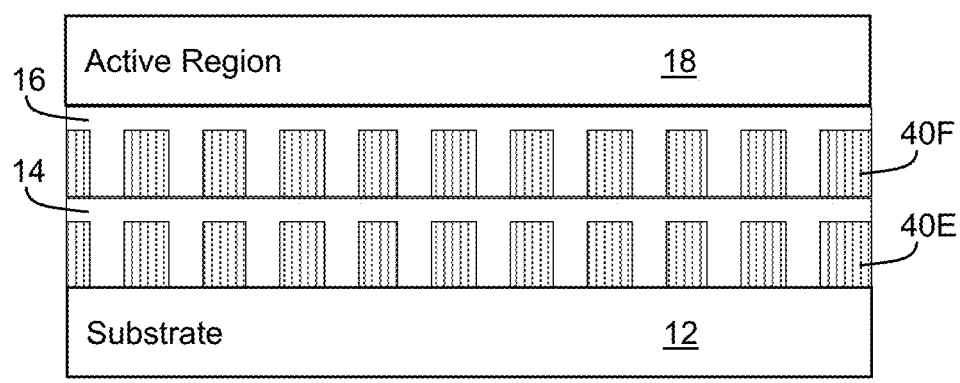
FIG. 4 shows an illustrative schematic structure where AAO layers are located on both sides of a buffer layer according to an embodiment.

Similarly, an AAO layer can be formed on the buffer layer 14 prior to growing the n-type layer 16 to, for example, provide stress relief and/or wave guiding. To this extent, FIG. 4 shows an illustrative schematic structure where AAO layers 40E, 40F are located on both sides of a buffer layer 14 according to an embodiment. While two AAO layers 40E, 40F are shown, it is understood that an embodiment can include only AAO layer 40F. Regardless, in this case, after epitaxial growth of the buffer layer 14, the AAO layer 40F can be deposited thereon. Subsequently, epitaxial growth can restart with growth of the n-type layer 16 followed by growth of the active region 18. It is understood that while the openings in the AAO layers 40E, 40F are shown having substantially the same sizes and being substantially aligned, this may not be the case and the AAO layers 40E, 40F can include openings having any type of arrangement and alignment.

The arrangement size and morphology of the pores of an AAO layer can be selected based on target criteria for the AAO layer. For example, considering the AAO layers 40A, 40B shown in FIG. 1, the target criteria can include a desired conductivity, a desired reflectivity, a desired transparency, and/or the like, of the corresponding contact 24, 28, respectively. For instance, depending on a desired refractive index of the AAO layer, the pores can have large or small diameter, and low or high density.

Figure 5A:
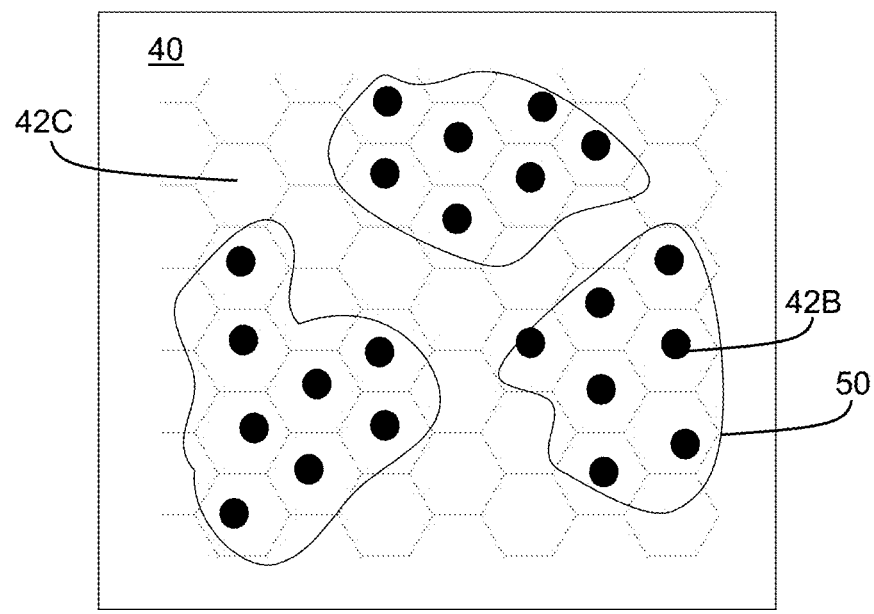
FIGS. 5A-5C show illustrative pore distributions and morphologies of an AAO layer according to embodiments.
Figure 5B:
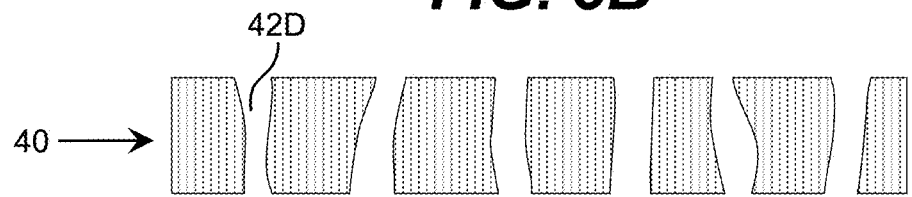
Figure 5C:
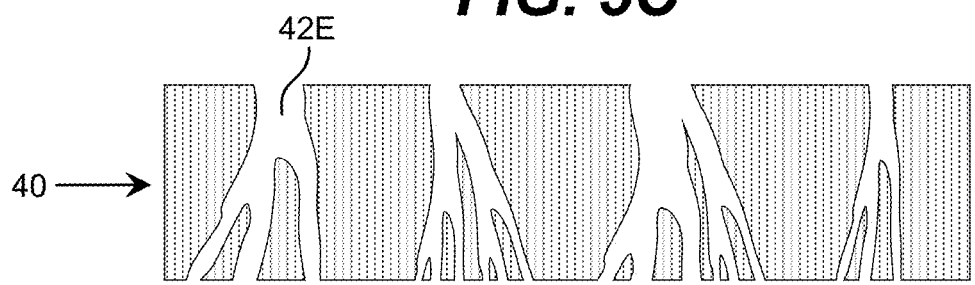

FIGS. 5A-5C show illustrative pore distributions and morphologies according to embodiments. FIG. 5A shows a top view of an AAO layer 40, where the pores 42B, 42C can be filled with different materials. For example, the pores 42B can be filled with a first material 50, while the remaining pores 42C can be filled with a second material distinct from the first material 50. As illustrated, the first material 50 can form domain structures or larger islands, which are separated by domain(s) formed of the second material. In an illustrative embodiment, such as for AAO layers 40A, 40B shown in FIG. 1, the first material 50 comprises a metallic material while the second material is a different metallic medium, a different transparent conductive oxide medium, a dielectric medium, a gas, a combination of two or more of these materials, and/or the like.

In an embodiment, the pores 42B, 42C are filled with two distinct conductive media. For example, the first material 50 can have a first set of properties (e.g., conductivity, reflectivity, transparency, and/or the like) while the other material has a second set of properties. In a more particular embodiment, one set of properties can be highly transparent/reflective while the other set of properties contributes to formation of an ohmic contact. In a still more particular embodiment, the first material 50 can comprise a highly reflective metallic contact with relatively poor conductive properties, such as aluminum, while the other material includes nickel, palladium, or the like, and forms a better ohmic contact while being less reflective. In an embodiment, the first and second materials and pores are configured such that at least ten percent of a lateral area is transparent.

In an embodiment, some or all of the pores 42B, 42C can be filled with an ultraviolet transparent polymer, such as a fluoropolymer, a thin layer of glass, and/or the like. Additionally, some or all of the pores 42B, 42C can be filled with a partially ultraviolet reflective material, such as a metal. In a more particular embodiment, the metal can comprise a metal with a low melting point (i.e., below 300 degrees Celsius), a fusible metallic alloy, and/or the like. Regardless, it is understood that the pores 42B, 42C can be completely or only partially filled with a material. Additionally, as discussed herein, it also is understood that several different filler materials can be used for a given AAO layer 40. For example, in an embodiment, the material filling the pores of an AAO layer located at the outer edge can comprise a fusible metallic alloy, while the material filling the pores located at the inner portion of the AAO layer can comprise an ultraviolet transparent polymer.

It is further understood that the filler material can have a thermal expansion coefficient, which allows the filler material to expand out of the pores of the AAO layer when heated and to contract to fill only a portion of the pores when cooled. To this extent, in an embodiment, the filler material can be deposited over the AAO layer, with layer of filler material being heated resulting in expansion of the filler material. Illustrative filler material includes, for example, a fusible metallic alloy. Subsequent cooling of the filler material can affect a distribution of the filler material within the pores of the AAO layer, resulting in modification of the pore/filler material interfaces and resulting in light scattering.

While the pores of the AAO layers have been generally shown as having a substantially rectangular cross section, it is understood that this is only illustrative of possible cross sections of pores. To this extent, in FIG. 5B, an AAO layer 40 is shown including pores 42D having irregular cross-sections, while in FIG. 5C, an AAO layer 40 is shown including pores 42E forming tree-like structures. The different cross-sections for the pores 42D, 42E can be formed, for example, by altering a voltage used during the anodization process. For instance, the anodization potential can be decreased in a stepwise way. To this extent, the initial anodization potential can be 40V, followed by 30V at about 500 seconds, followed by 25V at about 1000 seconds, followed by 18V at about 1500 seconds. It is understood that the above schedule is only representative, and variations of this schedule can result in variations in tree branching.

Figure 6A:
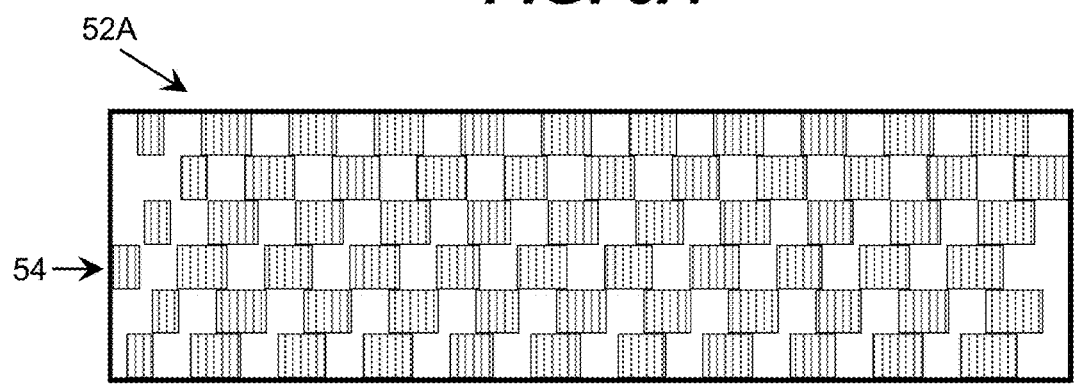
FIGS. 6A-6C show illustrative structures, which are formed using multiple steps of aluminum deposition and anodization according to embodiments.
Figure 6B:
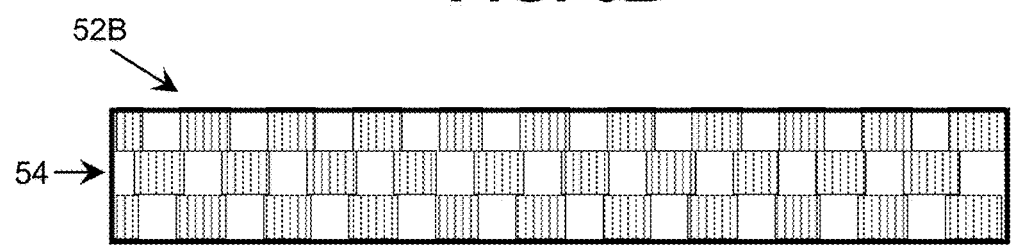
Figure 6C:
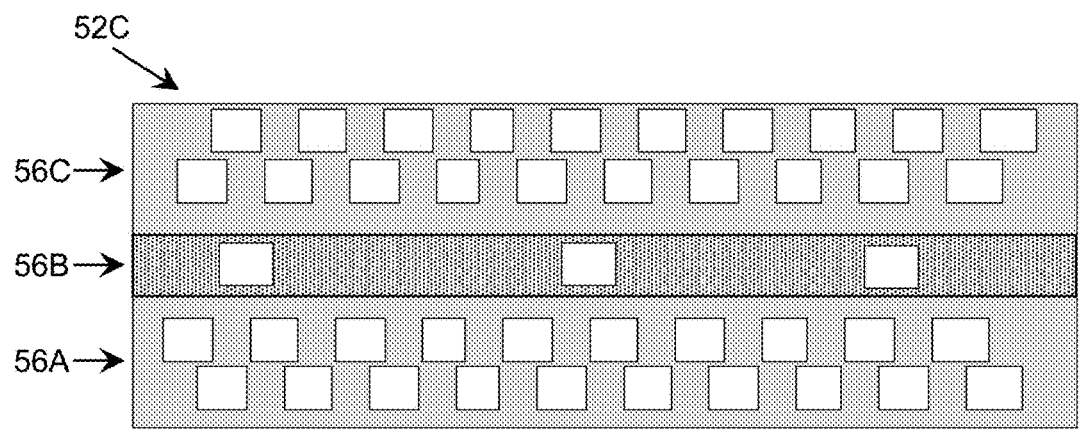

In an embodiment, one or more AAO layers can be incorporated into a compound structure, which can be located in the device 10 (FIG. 1). Various complex structures with staggered arrangement of the pores, controlled averaged index of refraction, and/or the like, can be achieved. To this extent, FIGS. 6A-6C show illustrative structures 52A-52C, respectively, which are formed using multiple steps of aluminum deposition and anodization according to embodiments. In FIGS. 6A and 6B, the structures 52A, 52B are formed from multiple AAO sub-layers 54 (six shown in FIG. 6A, three shown in FIG. 6B) stacked on one another. In this case, each AAO sub-layer 54 can be formed by depositing aluminum and anodizing the sub-layer 54 prior to commencing formation of the next AAO sub-layer 54. In the structure 52A, the pores of the sub-layers 54 (indicated by blank areas) have a staggered arrangement, while the pores of the sub-layers 54 in the structure 52B form a photonic crystal.

FIG. 6C shows an illustrative structure 52C, which includes three regions 56A-56C. The regions 56A, 56C have relatively large densities of pores and are formed from multiple AAO sub-layers, while the middle region 56B is formed of a single AAO sub-layer, which has a small density of pores relative to the regions 56A, 56C. The index of refraction for the regions 56A, 56C can be smaller than that of the middle region 56B, thereby forming a wave guiding structure. Such a wave guiding structure 52C can be incorporated into a semiconductor structure (e.g., over the second p-type layer 22 (FIG. 1) to, for example, waveguide emitted light to the edges of the structure of an edge emitting laser.

Figure 7:
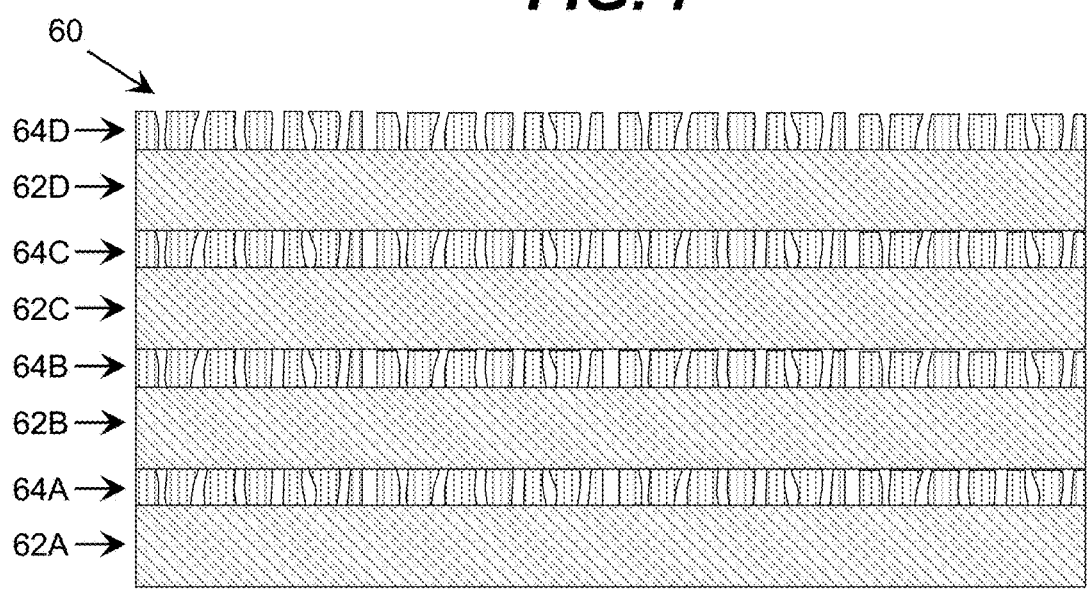
FIG. 7 shows an illustrative structure formed of four pairs of alternating semiconductor layers and AAO layers according to an embodiment.

In still another embodiment, a complex structure can be formed of alternating AAO layers and semiconductor layers. For example, FIG. 7 shows an illustrative structure 60 formed of four pairs of alternating semiconductor layers 62A-62D and AAO layers 64A-64D according to an embodiment. Such a structure can be used, for example, for both wave guiding and relaxation of strain within a semiconductor layer. The structure can be incorporated into a buffer layer of the semiconductor heterostructure, or even can be used as a transitional layer between the buffer layer and an n-type cladding layer. Alternatively, such structure can be incorporated into a p-type contact structure.

Figure 8:
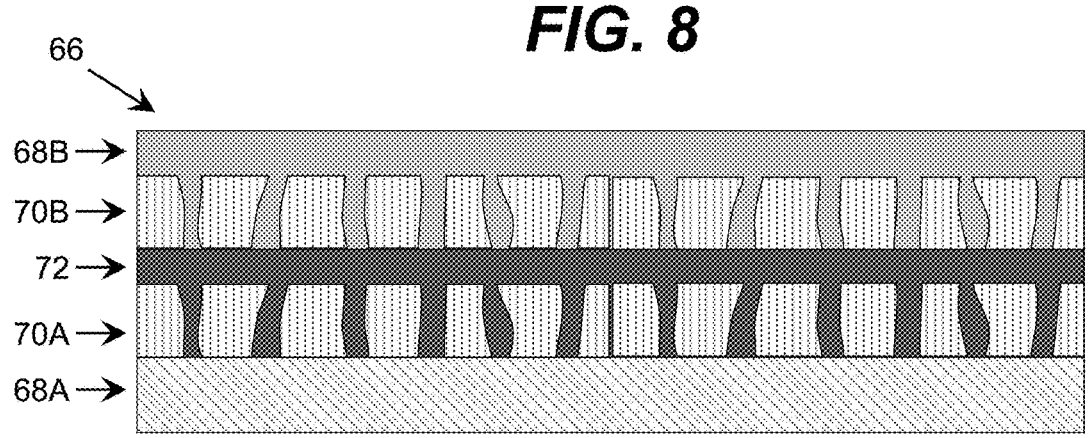
FIG. 8 shows an illustrative structure including semiconductor and metal layers as well as multiple AAO layers according to an embodiment.

Similarly, formation of a complex structure also can include metal deposition. For example, FIG. 8 shows an illustrative structure 66 including semiconductor and metal layers as well as multiple AAO layers according to an embodiment. In particular, formation of the structure 66 can include: growth of a first semiconductor layer 68A; formation of a first AAO layer 70A; deposition of a metal layer 72 (which penetrates the pores of the AAO layer 70A); formation of a second AAO layer 70B; and growth of a second semiconductor layer 68B (which penetrates the pores of the AAO layer 70B). While this is only an illustrative embodiment, it demonstrates the flexibility at which an AAO layer described herein can be used to connect semiconductor structures and metallic layers. Such structures can be used for formation of complex contact layers for a device.

Figure 9A:
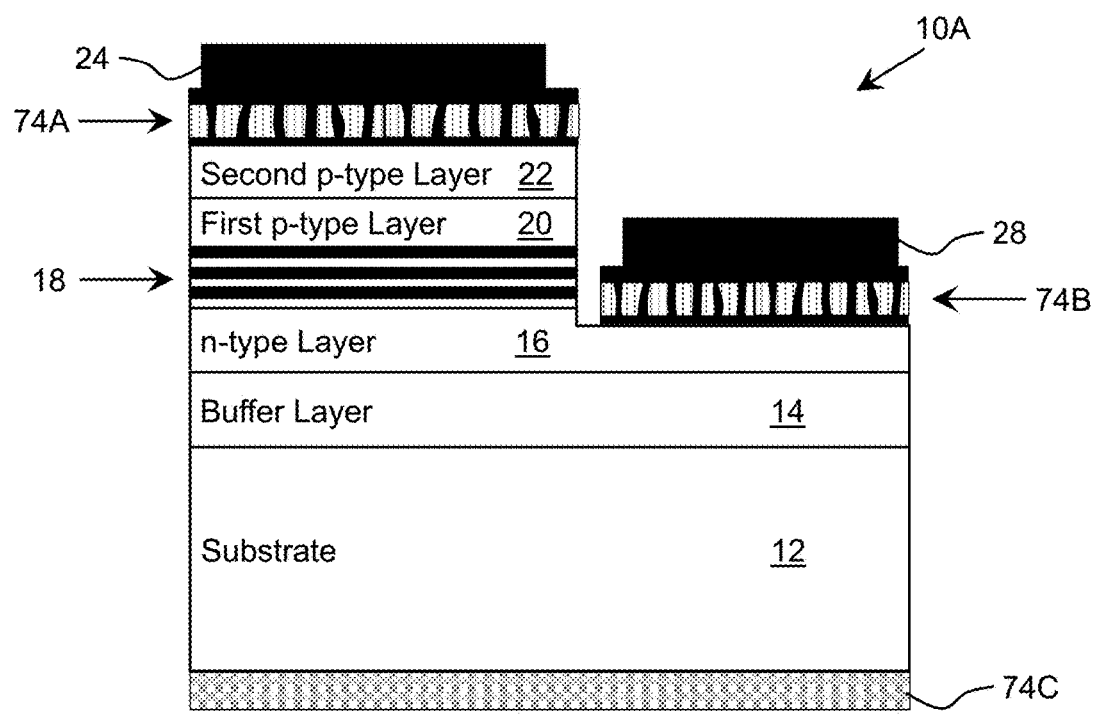
FIGS. 9A-9C show illustrative optoelectronic devices according to embodiments.
Figure 9B:
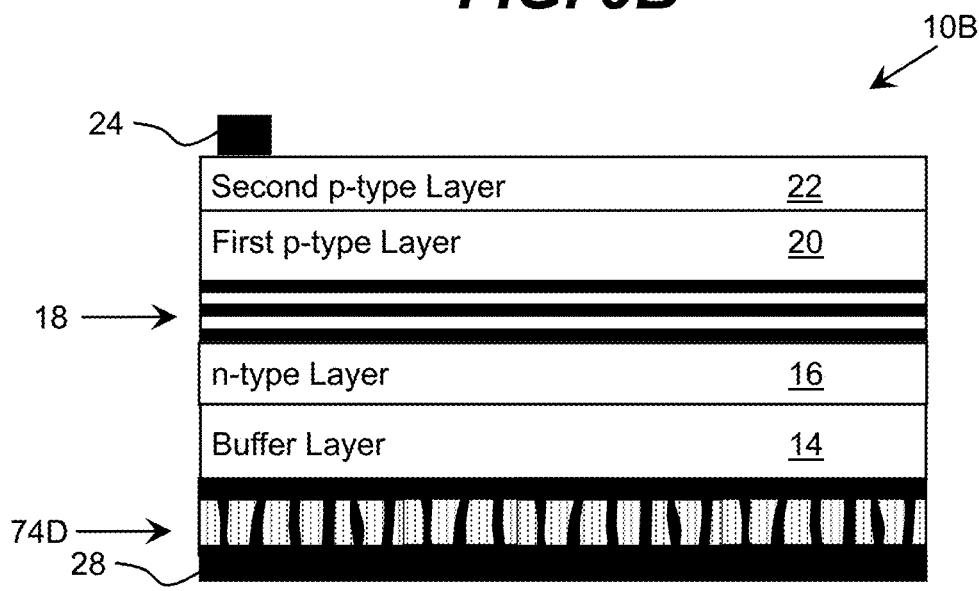
Figure 9C:
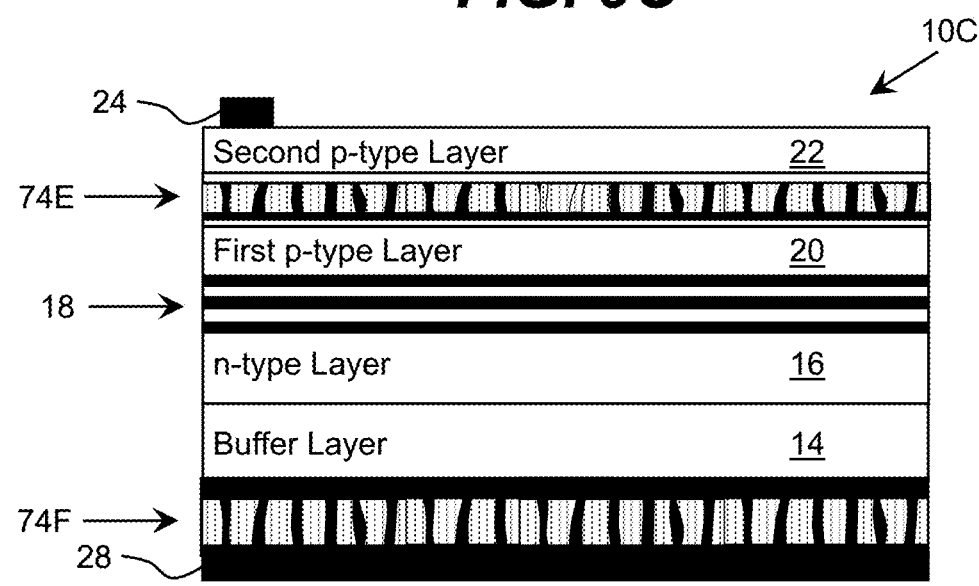

A structure described in conjunction with FIGS. 6A-8 can be incorporated into any of various locations of an optoelectronic device. To this extent, FIGS. 9A-9C show illustrative optoelectronic devices 10A-10C according to embodiments. In FIG. 9A, the optoelectronic device 10A is shown including an AAO structure 74A located adjacent to the p-type contact 24, an AAO structure 74B located adjacent to the n-type contact 28, and an AAO structure 74C located on a bottom surface of the substrate 12. The optoelectronic device 10A can have a flip chip design, in which case radiation is primarily emitted from the structure 74C. In this case, the structures 74A, 74B can be configured to have reflective properties, while the structure 74C can be configured to improve emission of radiation from the device 10A, e.g., through wave guiding, a photonic crystal, and/or the like.

In FIG. 9B, an optoelectronic device 10B having a vertical design (e.g., a vertical light emitting diode) is shown. In this case, radiation can be primarily emitted from the second p-type layer 22. As a result, the p-type contact 24 can be configured to only obscure a small portion of the second p-type layer 22. The optoelectronic device 10B is shown including an AAO structure 74D located adjacent to the n-type contact 28. The AAO structure 74D can be configured to have reflective properties. In an embodiment, the AAO structure 74D comprises an AAO layer with metal from the n-type contact 28 located within at least a portion of the pores as described herein with respect to a p-type contact.

In FIG. 9C, the optoelectronic device 10C includes AAO structures 74E, 74F, which are located adjacent to the p-type contact 24 and the n-type contact 28, respectively. In an embodiment, the AAO structures 74E, 74F comprise transparent structures capable of transmitting at least a portion of the radiation emitted by the active region 18. In a further embodiment, one or both AAO structures 74E, 74F comprise wave guiding structures, to direct radiation emitted by the active region 18 to an edge of the device 10C (e.g., for an edge emitting laser).

An optoelectronic device can include one or more AAO films configured to provide additional emission enhancement by a tunable localized-surface-plasmon (LSP). For example, a tunable LSP can result when radiation interacts with metallic contact islands formed by depositing a metallic layer through the pores of an AAO film, thereby forming metallic islands. Such metallic islands can be tuned to a resonance condition of the radiation absorbed or emitted by the semiconductor heterostructure. An illustrative metallic contact capable of exciting LSP can be formed of platinum, aluminum, or the like. Tuning can be achieved, for example, by selecting the size of the pores and selection of the conducting metal to match the resonance condition for creation of the LSP.

Figure 10A:
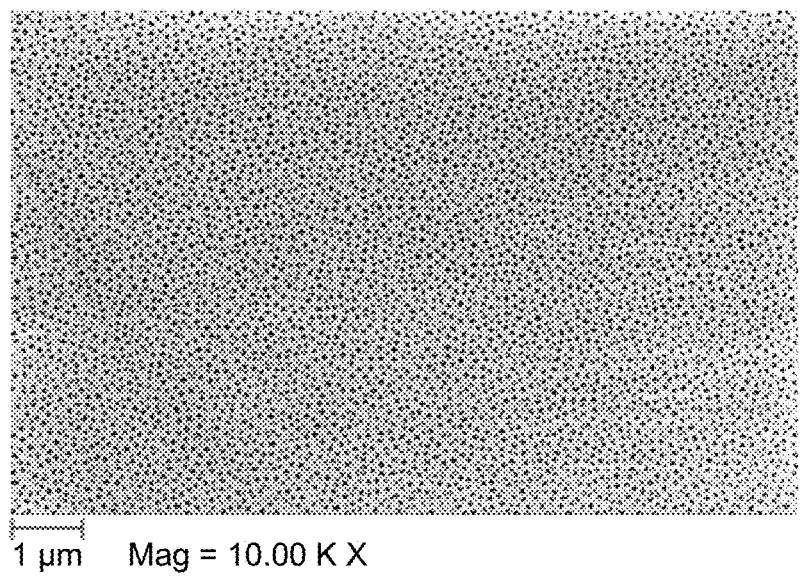
FIGS. 10A, 10B show overview and zoomed images, respectively, of an AAO layer according to an embodiment.
Figure 10B:
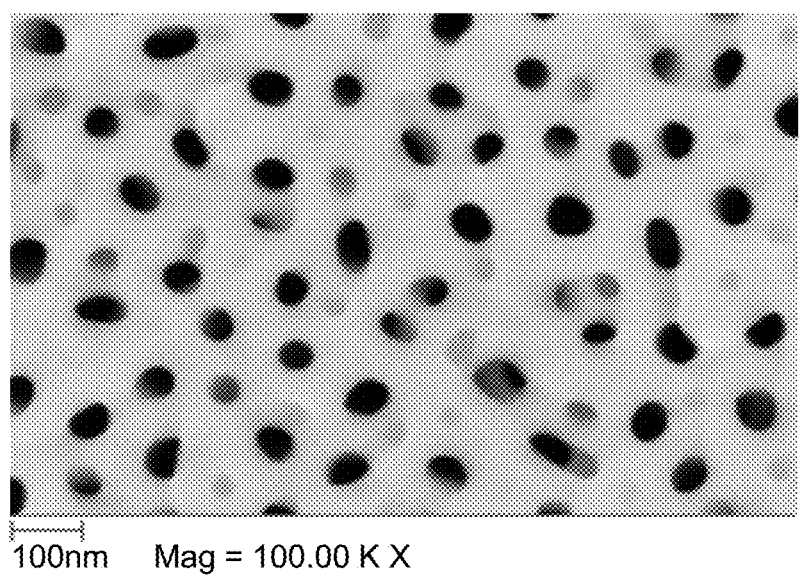
Figure 11A:
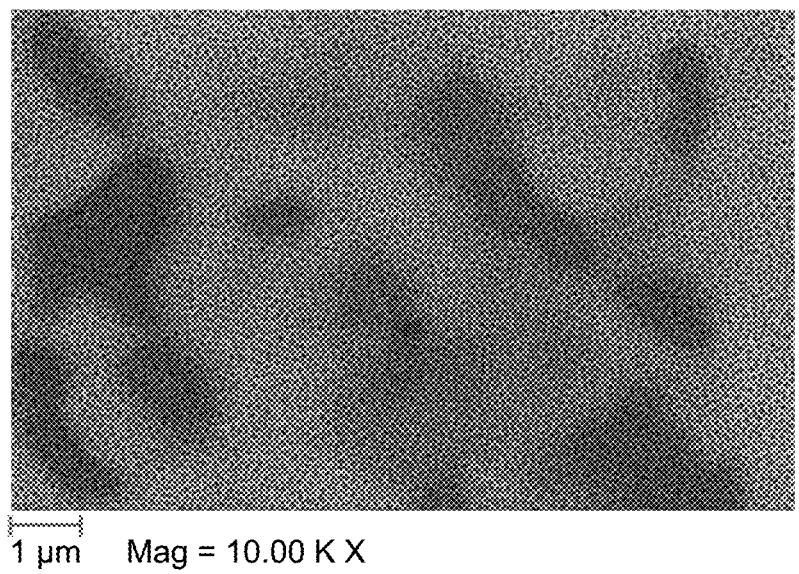
FIGS. 11A, 11B show overview and zoomed images, respectively, of another AAO layer according to an embodiment.
Figure 11B:
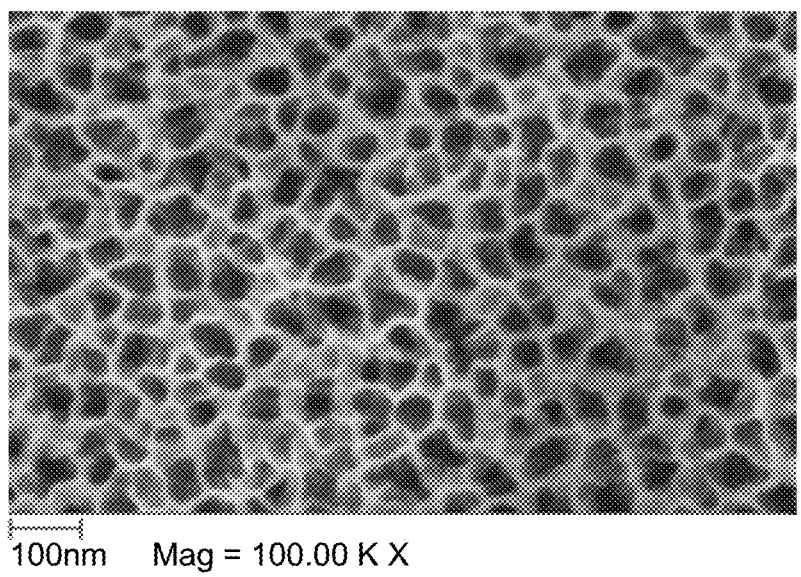
Figure 12A:
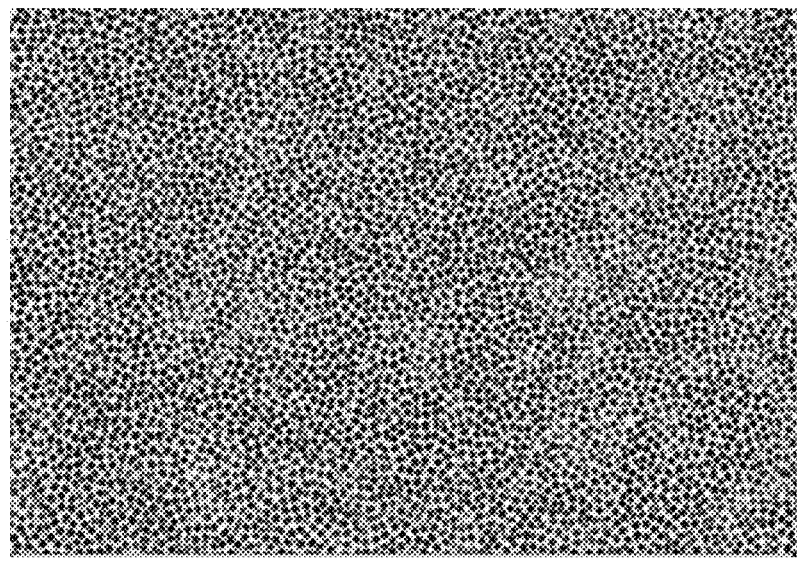
FIGS. 12A, 12B show overview and zoomed images, respectively, of still another AAO layer according to an embodiment.
Figure 12B:
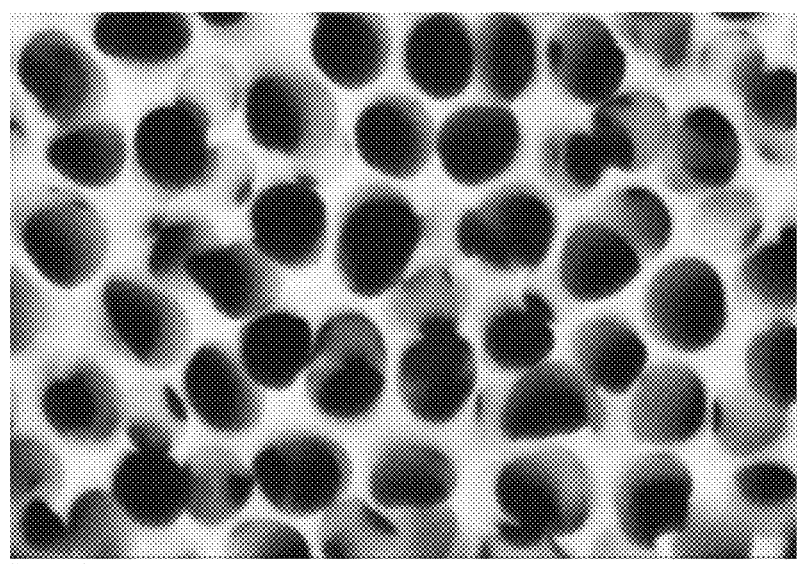

FIGS. 10A-12B show overview and zoomed images of illustrative AAO layers formed with differing morphologies according to embodiments. In particular, FIGS. 10A, 10B show overview and zoomed images, respectively, of an AAO layer having pores (dark regions) relatively small in size and a relatively large spacing between pores. In contrast, FIGS. 11A, 11B show overview and zoomed images, respectively, of another AAO layer having pores (dark regions) comparable in size to those of the AAO layer shown in FIGS. 10A, 10B, but having a much lower spacing. FIGS. 12A, 12B show overview and zoomed images, respectively, of an AAO layer having pores (dark regions) much larger in size to those of the AAO layers shown in FIGS. 10A-11B and having a separation comparable to that of the pores of the AAO layer shown in FIGS. 11A, 11B. As used herein, a relatively large spacing between pores corresponds to a characteristic distance between the centers of adjacent pores that is at least twice the characteristic size of the pores. The different pore morphologies can be selected based on target attributes (e.g., transparency, reflectivity, conductivity, and/or the like) of the AAO layer and the corresponding structure. For example, a morphology containing relatively large closely spaced pores can be used for low refractive index layers that can be used as a wave guiding cladding layers. These morphologies, when filled with metal, also can result in formation of a good conducting ohmic contact. Morphologies containing smaller sized pores spaced relatively far from each other can be utilized for their high transparency characteristics.

Figure 13:
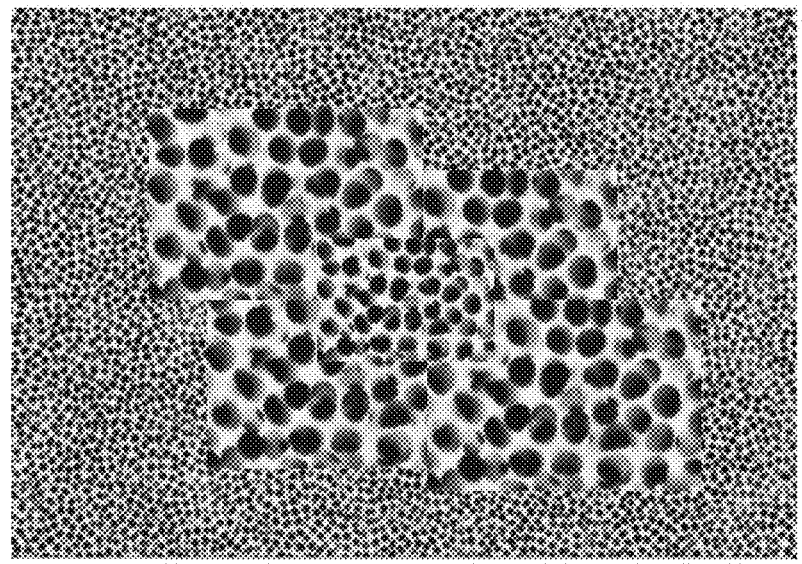
FIG. 13 shows an AAO layer with laterally inhomogeneous pores according to an embodiment.

In an embodiment, a density and/or size of the pores in an AAO layer described herein can vary laterally. In this case, the AAO layer can produce, for example, an effective index of refraction that varies laterally through the AAO layer. Such a variable index of refraction can form, for example, a media capable of lensing radiation. Lateral variability can be achieved, for example, by varying a concentration of the acid in the electrolyte solution during the anodization procedure. As used herein, the size of the pores can correspond to the depth and/or the characteristic diameter of the pores. In an embodiment, lateral variation can be defined as a difference of at least ten percent in the corresponding sizes and/or densities of the pores for regions including at least four percent of a total area of the AAO layer. FIG. 13 shows an illustrative AAO layer with laterally inhomogeneous pores according to an embodiment. In this case, the AAO layer is shown including three distinct sizes of pores, which are located in different regions of the AAO layer. However, it is understood that the locations and shapes of the pores, as well as the location, size and shape of the regions are only illustrative and various combinations of two or more sizes of pores and two or more regions can be implemented in embodiments.

Figure 14A:
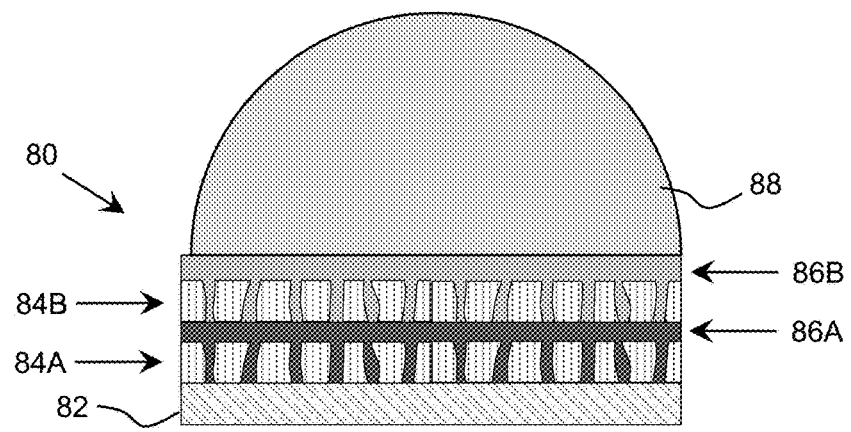
Figure 14B:
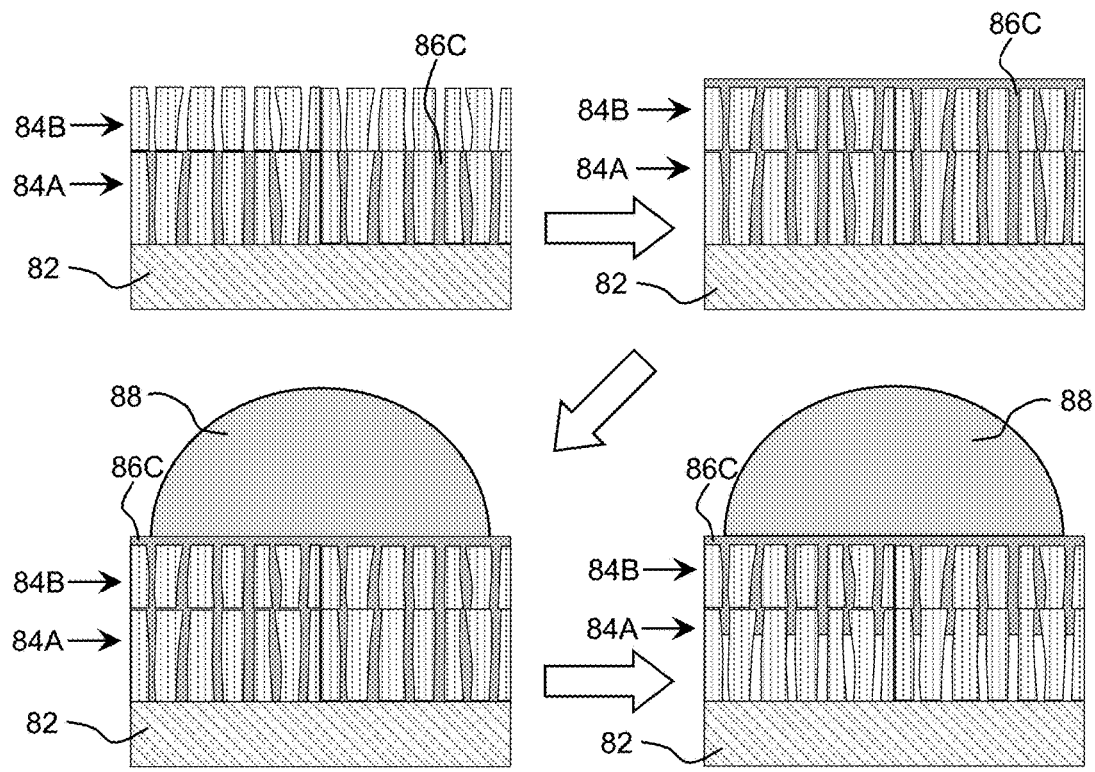
FIG. 14B shows an illustrative process for attaching a lens to an AAO layer according to an embodiment.

In an embodiment, a material used to fill the pores in an AAO layer can be utilized to attach one or more device components to a heterostructure described herein. For example, the device component can comprise an optical element such as a lens, an electrical element such as a contact 24, 28 (FIG. 1), and/or the like. To this extent, FIG. 14A shows a lens 88 attached to an AAO layer 84B via a filler material 86B according to an embodiment, while FIG. 14B shows an illustrative process for attaching a lens 88 to an AAO layer 84B according to an embodiment. It is understood that a lens 88 is only illustrative of various device components or structures which can be attached to an AAO layer using a process as described herein.

As shown in FIG. 14A, a structure 80 can include a first layer 82, on which one or more AAO layers 84A, 84B, each with pores filled with a corresponding filler material 86A, 86B, respectively, can be formed using a process described herein. The first layer 82 can comprise, for example, any layer of a semiconductor heterostructure for an optoelectronic device. To this extent, the first layer 82 can comprise, for example: the substrate 12 (FIG. 1); the n-type layer 16 (FIG. 1), e.g., after removal of the substrate and/or buffer layer from the heterostructure; a p-type layer 20, 22 (FIG. 1); and/or the like. While the lens 88 is shown covering substantially all of a cross sectional area of the structure 80, it is understood that a device component, such as the lens 88, can be attached to only a portion of a surface of the structure 80. For example, the lens 88 could be attached to a portion of a surface of an n-type or p-type contact layer, and the corresponding contact can be located, e.g., formed on or attached to, another portion of the same surface. When attached to the surface, it is understood that the contact can be attached using the same or a different type of filler material as utilized for the lens 88. In an embodiment, the AAO layer includes different types of filler materials under the regions corresponding to each of a plurality of device components located thereon. For example, the lens 88 can have a transparent material located thereunder, while the contact can have a conductive material located thereunder.

In an embodiment, a device component, such as the lens 88, is attached to an AAO layer via a second AAO layer located on a surface of the component. For example, the AAO layer 84A can be formed on the layer 82 of a structure, and the AAO layer 84B can be formed on a surface of the lens 88. Subsequently, the AAO layers 84A, 84B can be attached to each other, e.g., via the selection of suitable filler materials 86A, 86B. Illustrative filler materials include fluoropolymers or flowable oxides known in art.

FIG. 14B shows an illustrative process for attaching a component, such as a lens 88, to a structure using a filler material 86C, which expands and contracts during heating and cooling. For example, the filler material 86C can comprise a flowable oxide, such as hydrogen silsesquioxane, for example. Initially, the filler material 86C can be loaded into the pores of the AAO layers 84A, 84B using any solution, such as using a spin coating process. As illustrated, the filler material 86C can be deposited such that only a portion of the pores are filled with the filler material 86C. Subsequently, the filler material 86C can be heated, which causes the filler material 86C to expand to fill substantially all of the pores and at least a portion of a top surface of the AAO layer 84B. While expanded, the lens 88 can be placed on the AAO layer 84B and adhere to the filler material 86C. The filler material 86C can be allowed to cool, which will then cause a least a portion of the pores in the AAO layers 84A, 84B to include voids where no filler material 86C is present. Such voids can result in light scattering as it passes through the AAO layers 84A, 84B.

While illustrative aspects of the invention have been shown and described herein primarily in conjunction with a heterostructure for an optoelectronic device and a method of fabricating such a heterostructure and/or device, it is understood that aspects of the invention further provide various alternative embodiments.

Figure 15:
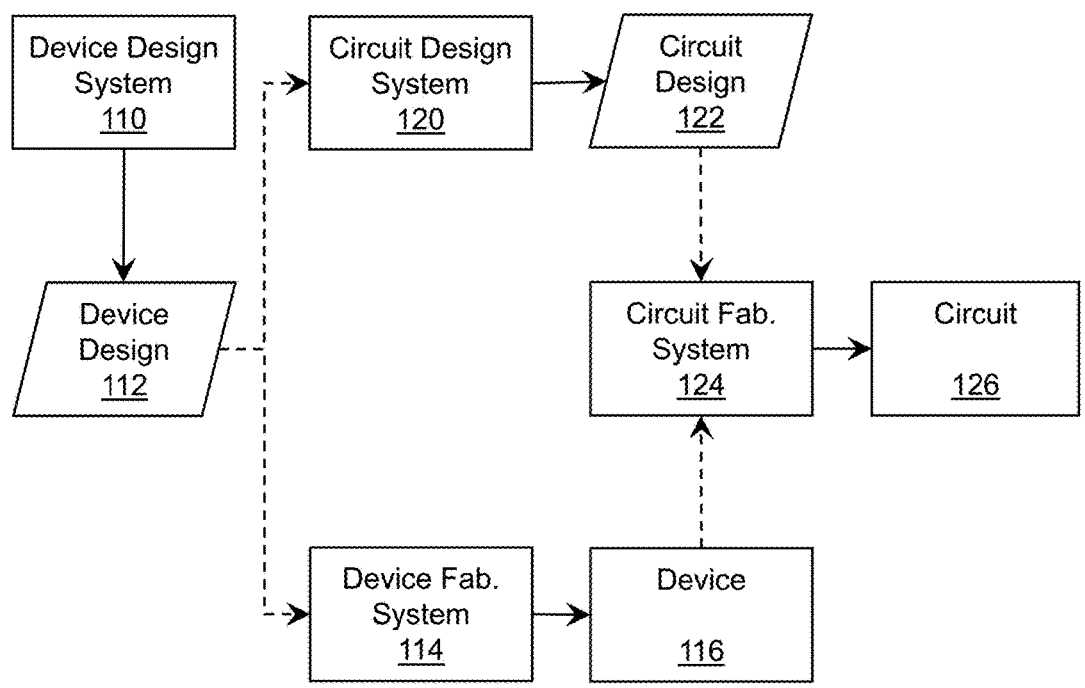
FIG. 15 shows an illustrative flow diagram for fabricating a circuit according to an embodiment.

In one embodiment, the invention provides a method of designing and/or fabricating a circuit that includes one or more of the devices designed and fabricated as described herein. To this extent, FIG. 15 shows an illustrative flow diagram for fabricating a circuit 126 according to an embodiment. Initially, a user can utilize a device design system 110 to generate a device design 112 for a semiconductor device as described herein. The device design 112 can comprise program code, which can be used by a device fabrication system 114 to generate a set of physical devices 116 according to the features defined by the device design 112. Similarly, the device design 112 can be provided to a circuit design system 120 (e.g., as an available component for use in circuits), which a user can utilize to generate a circuit design 122 (e.g., by connecting one or more inputs and outputs to various devices included in a circuit). The circuit design 122 can comprise program code that includes a device designed as described herein. In any event, the circuit design 122 and/or one or more physical devices 116 can be provided to a circuit fabrication system 124, which can generate a physical circuit 126 according to the circuit design 122. The physical circuit 126 can include one or more devices 116 designed as described herein.

In another embodiment, the invention provides a device design system 110 for designing and/or a device fabrication system 114 for fabricating a semiconductor device 116 as described herein. In this case, the system 110, 114 can comprise a general purpose computing device, which is programmed to implement a method of designing and/or fabricating the semiconductor device 116 as described herein. Similarly, an embodiment of the invention provides a circuit design system 120 for designing and/or a circuit fabrication system 124 for fabricating a circuit 126 that includes at least one device 116 designed and/or fabricated as described herein. In this case, the system 120, 124 can comprise a general purpose computing device, which is programmed to implement a method of designing and/or fabricating the circuit 126 including at least one semiconductor device 116 as described herein.

In still another embodiment, the invention provides a computer program fixed in at least one computer-readable medium, which when executed, enables a computer system to implement a method of designing and/or fabricating a semiconductor device as described herein. For example, the computer program can enable the device design system 110 to generate the device design 112 as described herein. To this extent, the computer-readable medium includes program code, which implements some or all of a process described herein when executed by the computer system. It is understood that the term "computer-readable medium" comprises one or more of any type of tangible medium of expression, now known or later developed, from which a stored copy of the program code can be perceived, reproduced, or otherwise communicated by a computing device.

In another embodiment, the invention provides a method of providing a copy of program code, which implements some or all of a process described herein when executed by a computer system. In this case, a computer system can process a copy of the program code to generate and transmit, for reception at a second, distinct location, a set of data signals that has one or more of its characteristics set and/or changed in such a manner as to encode a copy of the program code in the set of data signals. Similarly, an embodiment of the invention provides a method of acquiring a copy of program code that implements some or all of a process described herein, which includes a computer system receiving the set of data signals described herein, and translating the set of data signals into a copy of the computer program fixed in at least one computer-readable medium. In either case, the set of data signals can be transmitted/received using any type of communications link.

In still another embodiment, the invention provides a method of generating a device design system 110 for designing and/or a device fabrication system 114 for fabricating a semiconductor device as described herein. In this case, a computer system can be obtained (e.g., created, maintained, made available, etc.) and one or more components for performing a process described herein can be obtained (e.g., created, purchased, used, modified, etc.) and deployed to the computer system. To this extent, the deployment can comprise one or more of: (1) installing program code on a computing device; (2) adding one or more computing and/or I/O devices to the computer system; (3) incorporating and/or modifying the computer system to enable it to perform a process described herein; and/or the like.

The foregoing description of various aspects of the invention has been presented for purposes of illustration and description. It is not intended to be exhaustive or to limit the invention to the precise form disclosed, and obviously, many modifications and variations are possible. Such modifications and variations that may be apparent to an individual in the art are included within the scope of the invention as defined by the accompanying claims.

What is claimed is:

1. A semiconductor heterostructure comprising:
an active region configured to emit radiation;
a first semiconductor layer located on a first side of the active region;
an anodic aluminum oxide layer immediately adjacent to the first semiconductor layer, wherein the anodic aluminum oxide layer includes a plurality of pores extending only to an adjacent surface of the first semiconductor layer, wherein an entire bottom portion of each of the plurality of pores interfaces with the adjacent surface of the first semiconductor layer;
a layer of a first material immediately adjacent to the anodic aluminum oxide layer, wherein the layer of first material covers the plurality of pores, penetrates a first subset of the plurality of pores, and directly contacts the adjacent surface of the first semiconductor layer; and
a second material penetrating a second subset of the plurality of pores distinct from the first subset, wherein the second material is distinct from the first material.

2. The heterostructure of claim 1, wherein the first semiconductor layer comprises a contact layer and wherein at least one of the first or second materials is a conductive material forming an ohmic contact with the first semiconductor layer.

3. The heterostructure of claim 2, wherein the conductive material is a transparent conductive oxide.

4. The heterostructure of claim 2, wherein a characteristic distance between the plurality of pores is less than a current spreading length.

5. The heterostructure of claim 1, wherein at least one of the first or second materials is a reflective material.

6. The heterostructure of claim 1, wherein the first material is a metallic material and the second material is an ultraviolet transparent material.

7. The heterostructure of claim 6, wherein the first subset of the plurality of pores is located on an outer edge of the anodic aluminum oxide layer and the second subset of the plurality of pores is located on an inner portion of the anodic aluminum oxide layer.

8. The heterostructure of claim 1, wherein at least a portion of the second subset of the plurality of pores are only partially filled with the second material.

9. The heterostructure of claim 1, wherein at least one of: a density or a size of the plurality of pores varies laterally.

10. The heterostructure of claim 1, further comprising an optical element attached to the anodic aluminum oxide layer.

11. An optoelectronic device comprising:
a heterostructure including:
an active region configured to emit radiation during operation of the device;
an anodic aluminum oxide layer located on a first side of the active region immediately adjacent to a first semiconductor layer in the heterostructure, wherein the anodic aluminum oxide layer includes a plurality of pores extending entirely through the anodic aluminum oxide layer only to an adjacent surface of the first semiconductor layer in the heterostructure, wherein an entire bottom portion of each of the plurality of pores interfaces with the adjacent surface of the first semiconductor layer; and
a first filler material penetrating only a first subset of the plurality of-pores of the anodic aluminum oxide layer and directly contacting the adjacent surface of the first semiconductor layer, wherein a second subset of the plurality of pores distinct from the first subset are not penetrated by the first filler material.

12. The optoelectronic device of claim 11, further comprising a second filler material penetrating the second subset of the plurality of pores, wherein the second filler material is distinct from the first filler material.

13. The optoelectronic device of claim 11, wherein the anodic aluminum oxide layer is located on an external surface of the heterostructure.

14. The optoelectronic device of claim 13, further comprising a device component attached to an external surface of the anodic aluminum oxide layer using the first filler material.

15. The optoelectronic device of claim 14, wherein the device component is a lens.

16. The optoelectronic device of claim 13, wherein the first semiconductor layer in the heterostructure is one of: a substrate, an n-type contact layer, or a p-type contact layer.

17. A method of fabricating an optoelectronic device, the method comprising:
forming a heterostructure for the optoelectronic device, wherein the forming includes:
forming an active region configured to emit radiation during operation of the device;
forming an anodic aluminum oxide layer located on a first side of the active region immediately adjacent to a first semiconductor layer in the heterostructure, wherein the anodic aluminum oxide layer includes a plurality of pores extending entirely through the anodic aluminum oxide layer only to an adjacent surface of the first semiconductor layer in the heterostructure, wherein an entire bottom portion of each of the plurality of pores interfaces with the adjacent surface of the first semiconductor layer; and
causing a first filler material to penetrate only a first subset of the plurality of pores of the anodic aluminum oxide layer and directly contact the adjacent surface of the first semiconductor layer, wherein a second subset of the plurality of pores distinct from the first subset are not penetrated by the first filler material.

18. The method of claim 17, the method further comprising attaching a device component to an external surface of the anodic aluminum oxide layer using the first filler material.

19. The method of claim 18, wherein the device component is one of: a lens or a contact.

20. The method of claim 17, further comprising selecting a morphology for the plurality of pores based on at least one of: a desired conductivity, a desired reflectivity, or a desired transparency.

* * * * *